(12) United States Patent
Ishizuka et al.

(10) Patent No.: US 9,805,954 B2
(45) Date of Patent: Oct. 31, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Akihiro Ishizuka, Sagamihara (JP); Shinya Sasagawa, Chigasaki (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 132 days.

(21) Appl. No.: 14/567,235

(22) Filed: Dec. 11, 2014

(65) Prior Publication Data

US 2015/0093855 A1    Apr. 2, 2015

Related U.S. Application Data

(62) Division of application No. 13/545,791, filed on Jul. 10, 2012, now Pat. No. 8,946,812.

(30) Foreign Application Priority Data

Jul. 21, 2011 (JP) .................................. 2011-160097

(51) Int. Cl.
H01L 21/4757 (2006.01)
H01L 27/12 (2006.01)
(Continued)

(52) U.S. Cl.
CPC .. *H01L 21/47573* (2013.01); *H01L 21/02554* (2013.01); *H01L 21/02587* (2013.01);
(Continued)

(58) Field of Classification Search
None
See application file for complete search history.

(56) References Cited

U.S. PATENT DOCUMENTS 4,729,815 A * 3/1988 Leung ................. H01L 21/3065
257/E21.218
5,320,708 A * 6/1994 Kadomura ........ H01L 21/02063
257/E21.218
(Continued)

FOREIGN PATENT DOCUMENTS

EP    0666590 A    8/1995
EP    1160852 A    12/2001
(Continued)

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
(Continued)

*Primary Examiner* — Jesse Y Miyoshi
*Assistant Examiner* — Steven B Gauthier
(74) *Attorney, Agent, or Firm* — Robinson Intellectual Property Law Office; Eric J. Robinson

(57) ABSTRACT

A manufacturing method forms an oxide insulating layer and a first plasma etching treatment forms a depressed portion therein. A second plasma etching treatment forms a trench including curved lower corner portions. An oxide semiconductor film is formed in contact with a bottom portion, the curved lower corner portions, and side portions of the trench. Source and electrodes are formed to be electrically connected to the oxide semiconductor film. A gate insulating layer is formed over the oxide semiconductor film and a gate electrode is formed over the gate insulating layer. The first plasma etching treatment is performed with a first bias power and a first power of a first power source, and the second plasma etching treatment is performed with a second bias power and a second power of a second power source,
(Continued)

wherein the second bias power is lower than the first bias power.

10 Claims, 14 Drawing Sheets

(51) Int. Cl.
    H01L 29/423    (2006.01)
    H01L 29/786    (2006.01)
    H01L 21/02     (2006.01)
    H01L 29/66     (2006.01)

(52) U.S. Cl.
    CPC .... *H01L 21/02639* (2013.01); *H01L 27/1225* (2013.01); *H01L 29/42384* (2013.01); *H01L 29/66969* (2013.01); *H01L 29/7869* (2013.01); *H01L 29/78696* (2013.01)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,783,491 | A | 7/1998 | Nakamura et al. |
| 5,956,683 | A | 9/1999 | Jacobs et al. |
| 6,117,734 | A | 9/2000 | Nakamura |
| 6,294,274 | B1 | 9/2001 | Kawazoe et al. |
| 6,563,174 | B2 | 5/2003 | Kawasaki et al. |
| 6,566,270 | B1 | 5/2003 | Liu et al. |
| 6,594,628 | B1 | 7/2003 | Jacobs et al. |
| 6,710,401 | B2 | 3/2004 | Nakamura et al. |
| 6,727,522 | B1 | 4/2004 | Kawasaki et al. |
| 7,015,543 | B2 | 3/2006 | Kawamura et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,067,874 | B2 | 6/2006 | Nakamura et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,419,858 | B2 | 9/2008 | Schuele et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,872,309 | B2 | 1/2011 | Schuele et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0039670 | A1 | 2/2005 | Hosono et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0057649 | A1* | 3/2008 | Schuele ............ H01L 29/66621 438/270 |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0049661 | A1* | 3/2011 | Maehara ............ H01L 27/307 257/432 |
| 2011/0168997 | A1* | 7/2011 | Lee .................... H01L 27/1225 257/57 |
| 2011/0180796 | A1 | 7/2011 | Yamazaki et al. |
| 2013/0234241 | A1 | 9/2013 | Bowers |

FOREIGN PATENT DOCUMENTS

| | | |
|---|---|---|
| EP | 1160872 A | 12/2001 |
| EP | 1381029 A | 1/2004 |
| EP | 1737044 A | 12/2006 |
| EP | 1942487 A | 7/2008 |
| EP | 2226847 A | 9/2010 |
| JP | 59-124166 A | 7/1984 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-251926 A | 9/1992 |

(56) References Cited

FOREIGN PATENT DOCUMENTS

| | | |
|---|---|---|
| JP | 05-251705 A | 9/1993 |
| JP | 07-263692 A | 10/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-023150 A | 1/2003 |
| JP | 2003-086000 A | 3/2003 |
| JP | 2003-086808 A | 3/2003 |
| JP | 2004-509464 | 3/2004 |
| JP | 2004-103957 A | 4/2004 |
| JP | 2004-259927 A | 9/2004 |
| JP | 2004-273614 A | 9/2004 |
| JP | 2004-273732 A | 9/2004 |
| JP | 2008-034760 A | 2/2008 |
| JP | 2008-060524 A | 3/2008 |
| WO | WO-95/17746 | 6/1995 |
| WO | WO-02/23611 | 3/2002 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display) , 2007, vol. 15, No. 1, pp. 17-22.

Parks et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

SEMICONDUCTOR DEVICE AND MANUFACTURING METHOD THEREOF

BACKGROUND OF THE INVENTION

1. Field of the Invention

The invention disclosed in this specification relates to a semiconductor device and a manufacturing method thereof.

2. Description of the Related Art

Attention has been focused on a technique for forming a transistor using a semiconductor thin film formed over a substrate having an insulating surface. The transistor is applied to a wide range of electronic devices such as an integrated circuit (IC) or an image display device. Further, a technique using a wide band gap semiconductor such as an oxide semiconductor for a semiconductor thin film applicable to a transistor has been attracting attention.

For example, Patent Document 1 shows that an oxide semiconductor including an In—Ga—Zn—O-based oxide can be used for a channel formation region of a thin film transistor.

REFERENCE

Patent Document

[Patent Document 1] Japanese Published Patent Application No. 2004-103957

SUMMARY OF THE INVENTION

In order to achieve high-speed operation, low power consumption, high integration, or the like of a transistor, it is necessary to miniaturize a transistor.

However, when a transistor is miniaturized, a problem of a short-channel effect arises. The short-channel effect refers to degradation of electrical characteristics which becomes obvious with miniaturization of a transistor. The short-channel effect results from the effect of an electric field of a drain on a source. As specific examples of the short-channel effect, a decrease in threshold voltage, an increase in a subthreshold swing (S) value, an increase in leakage current, and the like can be given.

The short-channel effect is likely to occur particularly in a transistor including an oxide semiconductor because it is difficult to control the threshold voltage of such a transistor by doping, unlike a transistor including silicon.

Accordingly, an object of one embodiment of the disclosed invention is to provide a miniaturized semiconductor device with stable electric characteristics. Another object of one embodiment of the disclosed invention is to provide a manufacturing method of the above-described semiconductor device.

In order to achieve the above-described objects, a trench is formed in an oxide insulating layer and a channel formation region of an oxide semiconductor film is formed in contact with the trench, so that the channel formation region extends in the depth direction (a direction perpendicular to a substrate). Thus, it is possible to miniaturize a transistor and to extend an effective channel length of the transistor.

The cross-sectional shape of the oxide semiconductor film in the channel length direction is formed along the cross-sectional shape of the trench. With this structure, as the trench becomes deeper, the channel length of a transistor increases. Therefore, the channel length of the oxide semiconductor film can be increased by setting the depth of the trench as appropriate even when the distance between a source electrode and a drain electrode is decreased; thus, a short-channel effect can be suppressed.

Further, lower corner portions of the trench are curved. An oxide semiconductor film is difficult to form in the lower corner portions of the trench, and the oxide semiconductor film is disconnected at the lower corner portions in some cases. Thus, when the lower corner portions of the trench are formed to be curved, disconnection of an oxide semiconductor film is suppressed and stable electric characteristics can be provided.

Further, side portions of the trench have side surfaces substantially perpendicular to the top surface of the oxide insulating layer. Thus, when the channel length of the oxide semiconductor film formed along the trench is increased, a short-channel effect can be suppressed and the transistor can be miniaturized.

In this specification, side portions of a trench refer to portions including side surfaces substantially perpendicular to the top surface of the oxide insulating layer and facing each other. The width between the side surfaces refers to a minimum distance between one of the side surfaces of the trench and the other facing the one in the direction parallel to the top surface of the oxide insulating layer. The bottom portion of the trench refers to a portion which is provided between the side portions facing each other and includes a deepest portion in the trench.

A region in which the side portion of the trench meets the bottom portion of the trench refers to the lower corner portion of the trench, and a region in which the side portion of the trench meets the top surface of the oxide insulating layer refers to the upper corner portion of the trench. Further, in a cross section in the channel length direction, the width between the upper ends of the trench refers to a length between a point in which the top surface of the oxide insulating layer meets one of the side surfaces of the trench and a point in which the top surface of the oxide insulating layer meets the other of the side surfaces of the trench. Alternatively, in the cross section in the channel length direction, the width between the upper ends of the trench refers to a length between a point in which an extended line of the top surface of the oxide insulating layer meets an extended line of one of the side surfaces of the trench and a point in which the extended line of the top surface of the oxide insulating layer meets an extended line of the other of the side surfaces of the trench.

Thus, one embodiment of the present invention is a semiconductor device including: an oxide insulating layer in which a trench is formed; an oxide semiconductor film in contact with a bottom portion, lower corner portions, and side portions of the trench in the oxide insulating layer; a source electrode and a drain electrode which are electrically connected to the oxide semiconductor film; a gate insulating layer over the oxide semiconductor film; and a gate electrode over the gate insulating layer. The side portions of the trench have side surfaces substantially perpendicular to a top surface of the oxide insulating layer. The width between the upper ends of the trench is greater than or equal to 1 time and less than or equal to 1.5 times the width between the side surfaces. The bottom portion or the lower corner portion in which the bottom portion meets the side portion is curved.

In a semiconductor device of one embodiment of the present invention, an oxide semiconductor film is formed in contact with a trench formed in an oxide insulating layer, so that the oxide semiconductor film in the channel length direction is formed along the trench in the cross section. Accordingly, as the trench is formed deeper, the channel length is increased. Therefore, the channel length of the oxide semiconductor film can be secured even when the distance between a source electrode and a drain electrode is decreased; thus, a short-channel effect can be suppressed. Further, the oxide semiconductor film is provided in contact with the oxide insulating layer, so that oxygen can be supplied from the oxide insulating layer to the oxide semiconductor film and oxygen defects in the oxide semiconductor film can be reduced.

Further, the side portions of the trench have side surfaces substantially perpendicular to the top surface of the oxide insulating layer, so that the width between the upper ends of the trench is not increased as compared to the width between the side surfaces of the trench; thus, a miniaturized transistor can be manufactured. Note that here, the term "substantially perpendicular" means 80° to 100°, inclusive.

Further, since the lower corner portions of the trench are curved, disconnection of the oxide semiconductor film in the lower corner portions can be prevented and stable electric characteristics can be provided. Further, the width between the upper ends of the trench is greater than or equal to 1 time and less than or equal to 1.5 times the width between the side surfaces of the trench.

Further, the curved surface of each of the lower corner portions of the trench preferably has a curvature radius of 20 nm to 70 nm, inclusive. When the lower corner portions are gently curved, disconnection of the oxide semiconductor film in the lower corner portions can be prevented and stable electric characteristics can be provided. Further, the upper corner portions of the trench may also be curved. When the upper corner portions of the trench are also curved, the coverage with the oxide semiconductor film is improved, so that an electrically stable semiconductor device can be provided.

Further, since the width between the side surfaces of the trench is set to a small width such as 0.2 µm to 0.3 µM, inclusive, a miniaturized transistor can be manufactured even when the trench is provided.

One embodiment of the present invention is a manufacturing method of a semiconductor device, in which an oxide insulating layer is formed; a trench whose lower corner portions are curved is formed by performing first plasma etching treatment and second plasma etching treatment; an oxide semiconductor film which is in contact with the bottom portion, the lower corner portions, and the side portions of the trench in the oxide insulating layer is formed; a source electrode and a drain electrode which are electrically connected to the oxide semiconductor film is formed; a gate insulating layer is formed over the oxide semiconductor film; and a gate electrode is formed over the gate insulating layer. The first plasma etching treatment is performed on the oxide insulating layer with application of bias voltage in order to form a depressed portion including side surfaces substantially perpendicular to a top surface of the oxide insulating layer is formed. The second plasma etching treatment is performed on the depressed portion with application of a bias voltage lower than that of the first plasma etching treatment.

One embodiment of the present invention is a manufacturing method of a semiconductor device, in which an oxide insulating layer is formed; a trench whose lower corner portions and upper corner portions are curved is formed by performing first plasma etching treatment, second plasma etching treatment, and third plasma etching treatment; an oxide semiconductor film which is in contact with the bottom portion, the lower corner portions, and the side portions of the trench in the oxide insulating layer is formed; a source electrode and a drain electrode which are electrically connected to the oxide semiconductor film is formed; a gate insulating layer is formed over the oxide semiconductor film; and a gate electrode is formed over the gate insulating layer. The first plasma etching treatment is performed on the oxide insulating layer with application of bias voltage in order to form a depressed portion including side surfaces substantially perpendicular to a top surface of the oxide insulating layer is formed. The second plasma etching treatment is performed on the depressed portion with application of a bias voltage lower than that of the first plasma etching treatment. The third plasma etching treatment is performed in a rare gas atmosphere on the depressed portion.

In the manufacturing method of a semiconductor device of one embodiment of the present invention, power density of the bias voltage used in the second plasma etching treatment is preferably set to 0 $W/cm^2$ to 0.03 $W/cm^2$, inclusive.

In this specification and the like, ordinal numbers such as "first", "second", and "third" are used in order to avoid confusion among components, and the terms do not limit the components numerically.

One embodiment of the present invention can provide a miniaturized semiconductor device with stable electric characteristics. Further, one embodiment of the present invention can provide a manufacturing method of the semiconductor device easily.

DETAILED DESCRIPTION OF THE INVENTION

Figure 1A:
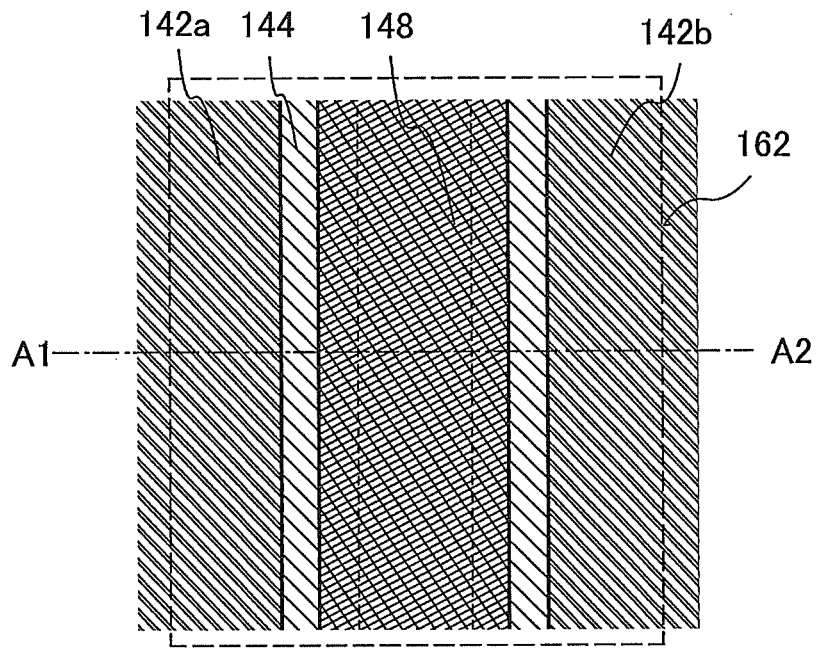
FIGS. 1A and 1B are a top view and a cross-sectional view, respectively, illustrating a semiconductor device of one embodiment of the present invention.

Hereinafter, embodiments of the present invention are described with reference to the drawings. Note that the invention is not limited to the following description, and it is easily understood by those skilled in the art that various changes and modifications can be made without departing from the spirit and scope of the invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric action" include a switching element such as a transistor, a resistor, a coil, a capacitor, and an element with a variety of functions in addition to an electrode and a wiring.

Functions of a source and a drain might interchange when a transistor of opposite polarity is used or the direction of current flow is changed in circuit operation, for example. Therefore, the terms "source" and "drain" can interchange in this specification.

Embodiment 1

Figure 1B:
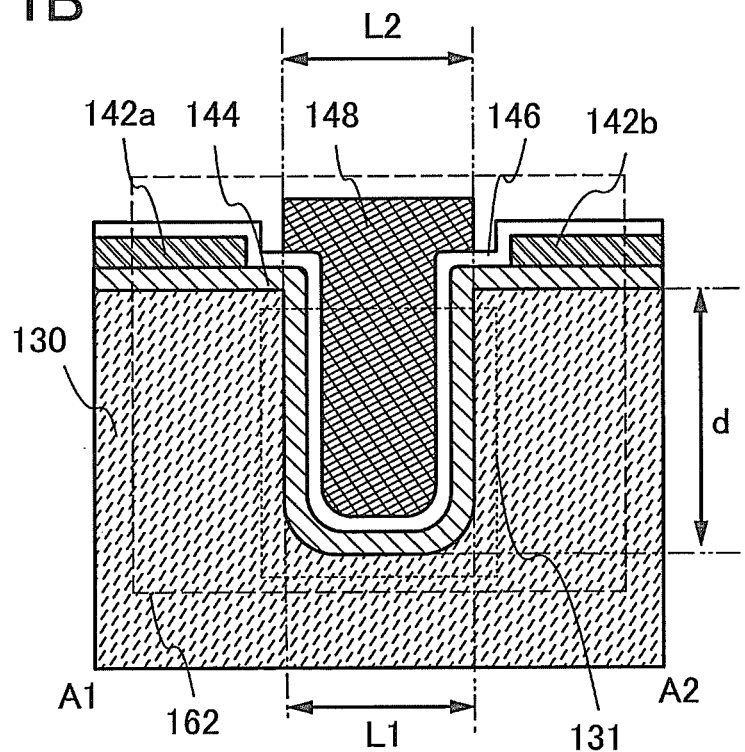

In this embodiment, a basic structure and a basic manufacturing method of a semiconductor device according to one embodiment of the present invention are described with reference to drawings. FIGS. 1A and 1B illustrate a semiconductor device of one embodiment of the present invention. FIG. 1A is a top view illustrating a semiconductor device of one embodiment of the present invention, and FIG. 1B is a cross-sectional view taken along dashed dotted line A1-A2 in FIG. 1A.

The transistor 162 illustrated in FIGS. 1A and 1B includes an oxide insulating layer 130 provided with a trench 131, an oxide semiconductor film 144, a gate insulating layer 146, a conductive layer 142a and a conductive layer 142b functioning as a source electrode and a drain electrode, and a gate electrode 148. Although not illustrated, the transistor 162 is provided over a substrate.

Lower corner portions of the trench 131 are curved. The curved surfaces of the lower corner portions of the trench 131 preferably each have a curvature radius of 20 nm to 70 nm, inclusive, more preferably 20 nm to 30 nm, inclusive. When the trench 131 is formed to have curved lower corner portions, disconnection of the oxide semiconductor film 144 provided over the oxide insulating layer 130 can be prevented in the lower corner portions of the trench 131, and the transistor 162 can have stable electric characteristics.

Further, side portions of the trench 131 have side surfaces substantially perpendicular to a top surface of the oxide insulating layer. Note that in this specification, the term "substantially perpendicular" means 80° to 100°, inclusive. Further, the width (L2 in FIG. 1B) of the upper ends of the trench is greater than or equal to 1 time and less than or equal to 1.5 times the width (L1 in FIG. 1B) of the side surfaces of the trench. Since the side surfaces of the trench are substantially perpendicular to the top surface of the oxide insulating layer, the width between the upper ends of the trench is almost the same as the width between the side surfaces of the trench and not increased as compared to the width between the side surfaces of the trench even when the depth (d in FIG. 1B) of the trench is made larger. Because the width between the upper ends of the trench is not increased as compared to the width between the side surfaces of the trench, a miniaturized transistor can be provided.

FIGS. 2A to 2C and FIGS. 3A and 3B illustrate an example of a manufacturing method of the transistor 162.

First, the oxide insulating layer 130 is formed over a substrate.

Although there is no particular limitation on a substrate that can be used as the substrate, the substrate needs to have at least heat resistance to withstand heat treatment performed later. For example, a glass substrate of barium borosilicate glass, aluminoborosilicate glass, or the like, a ceramic substrate, a quartz substrate, or a sapphire substrate can be used.

Alternatively, it is possible to use a single crystal semiconductor substrate or a polycrystalline semiconductor substrate of silicon, silicon carbide, or the like, a compound semiconductor substrate of silicon germanium or the like, an SOI substrate, any of these substrates provided with a semiconductor element, such as a semiconductor substrate provided with a driver circuit including a transistor with a MOSFET structure or a semiconductor substrate provided with a capacitor, or the like.

The oxide insulating layer 130 can have a thickness of 1 nm to 100 nm, inclusive, and can be formed by a sputtering method, an MBE method, a CVD method, a pulsed laser deposition method, an ALD method, or the like as appropriate. When the oxide insulating layer 130 is formed by a sputtering method, an oxide insulating layer in which impurities such as hydrogen are sufficiently reduced can be formed.

As the oxide insulating layer 130, silicon oxide, gallium oxide, aluminum oxide, silicon oxynitride, silicon nitride oxide, hafnium oxide, tantalum oxide, or the like is preferably used. Further, the oxide insulating layer 130 can be formed with a single-layer structure or a stacked-layer structure of these compounds. In the case of a stacked-layer structure, for example, it is possible to use a silicon oxide film formed by a CVD method as an oxide insulating layer which is in contact with a substrate and a silicon oxide film formed by a sputtering method as an oxide insulating layer which is in contact with the oxide semiconductor film 144.

An oxide insulating layer in which the concentration of hydrogen is reduced is used as the insulating layer which is in contact with the oxide semiconductor film 144, whereby, diffusion of hydrogen in the oxide semiconductor film 144 is prevented and a transistor having favorable electric characteristics can be provided because oxygen is supplied from the oxide insulating layer 130 to oxygen defects in the oxide semiconductor film 144.

Here, silicon oxynitride means the one that contains more oxygen than nitrogen and for example, silicon oxynitride includes oxygen, nitrogen, and silicon at concentrations ranging from 50 atomic % to 70 atomic %, inclusive, 0.5 atomic % to 15 atomic %, inclusive, and 25 atomic % to 35 atomic %, inclusive, respectively. Further, silicon nitride oxide means the one that contains more nitrogen than oxygen and for example, silicon nitride oxide includes oxygen, nitrogen, and silicon at concentrations ranging from 5 atomic % to 30 atomic %, inclusive, 20 atomic % to 55 atomic %, inclusive, and 25 atomic % to 35 atomic %, inclusive, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). In addition, the total of the percentages of the constituent elements does not exceed 100 atomic %.

The oxide insulating layer 130 is in contact with the oxide semiconductor film 144 and therefore preferably contains a large amount of oxygen which exceeds at least the stoichiometry in (a bulk of) the layer. For example, in the case where a silicon oxide film is used as the oxide insulating layer 130, the composition formula is $SiO_{2+\alpha}$, ($\alpha>0$).

Then, a plurality of trenches 131 (also referred to as grooves) is formed in the insulating layer to form an oxide insulating layer 130 provided with the trenches 131. As a method for forming the trench 131, a dry etching method using a photolithography method may preferably be used.

For example, a dry etching method such as an reactive ion etching (RIE) method, an inductively coupled plasma (ICP) etching method, an electron cyclotron resonance (ECR) etching method, a parallel-plate (capacitively coupled plasma) etching method, a magnetron plasma etching method, a dual-frequency plasma etching method, or a helicon wave plasma etching method can be used. As an etching gas, rare gas such as trifluoromethane ($CHF_3$), carbon tetrafluoride ($CF_4$), hydrogen, helium, or argon may be mixed as appropriate.

In this embodiment, the trench 131 whose lower corner portions are curved as illustrated in FIG. 1B is formed by two kinds of plasma etching treatment: the first plasma etching treatment in which a depressed portion is formed in an insulating layer with an ICP etching apparatus and the second plasma etching treatment in which the depressed portion is made curved.

First, a resist mask 151 is selectively formed on the top surface of the oxide insulating layer 130, and the first plasma etching treatment is performed on the oxide insulating layer 130 with the use of the resist mask. Accordingly, a depressed portion is formed (see FIG. 2A).

The first plasma etching treatment is performed by application of high-frequency voltage and bias voltage in an ICP etching apparatus with an etching gas filled. For example, voltage applied in the first plasma etching treatment is a voltage by which the electronic power becomes 475 W and the bias power becomes 300 W.

As an etching gas used for the first plasma etching treatment, for example, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferable. Alternatively, a gas containing fluorine (a fluorine-based gas such as carbon tetrafluoride ($CF_4$), sulfur hexafluoride ($SF_6$), nitrogen trifluoride ($NF_3$), trifluoromethane ($CHF_3$), or the like); hydrogen bromide (HBr); oxygen ($O_2$); any of these gases to which a rare gas such as helium (He) or argon (Ar) is added; a gas in which these gases are mixed as appropriate; or the like can be used.

Plasma is generated by application of high voltage to an etching gas, and chemically active excited species such as ions or radicals which are generated in this plasma are reacted with the oxide insulating layer 130. The oxide insulating layer 130 is etched by the reaction, so that the depressed portion is formed. Further, in the first plasma etching treatment, charged ions are drawn to a substrate side by bias voltage, so that anisotropic etching having directivity can be performed.

Figure 2A:
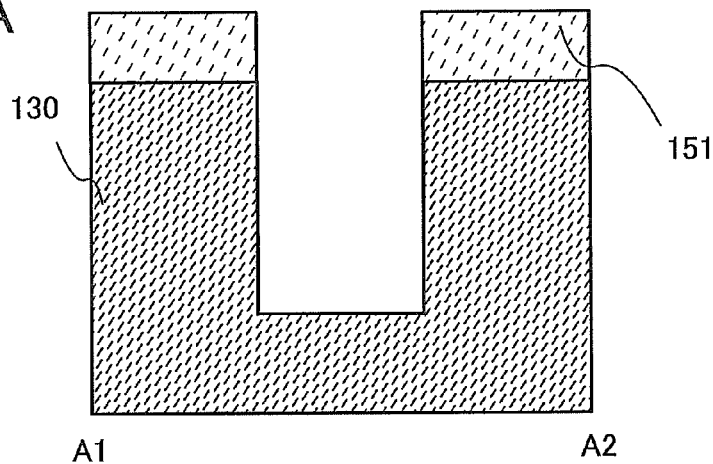
FIGS. 2A to 2C illustrate a manufacturing method of a semiconductor device of one embodiment of the present invention.
Figure 2B:
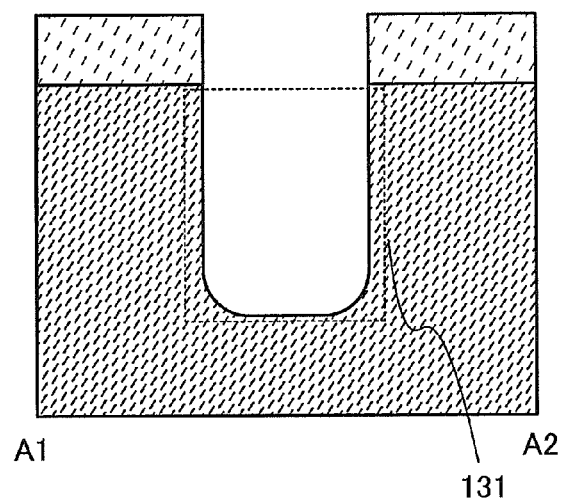

Then, the second plasma etching treatment is performed on the depressed portion formed by the first plasma etching treatment, so that the lower corner portions of the depressed portion are curved (see FIG. 2B). In the second plasma etching treatment, a bias voltage lower than that of the first plasma etching treatment is applied. When a bias voltage lower than that of the first plasma etching treatment is applied, ions and radicals generated in the etching apparatus are not drawn to the substrate side; thus, isotropic etching can be performed. Accordingly, the lower corner portions of the depressed portion formed by the first plasma etching treatment are etched isotropically, so that the lower corner portions of the depressed portion are curved.

Bias voltage applied in the second plasma etching treatment is preferably a voltage by which the density of power applied to the oxide insulating layer becomes lower than or equal to 0.03 $W/cm^2$, preferably lower than or equal to 0.009 $W/cm^2$. Bias voltage is not necessarily applied in the second plasma etching treatment. When a high bias voltage by which the density of power becomes 0.8 $W/cm^2$, for example, is applied in the second plasma etching treatment, anisotropic etching treatment is performed as well as the first plasma etching treatment. Thus, the depressed portion does not have curved lower corner portions as well as the depressed portion just after the first plasma etching treatment. Accordingly, disconnection of the oxide semiconductor film to be formed might be generated in the lower corner portions in some cases.

The trench 131 formed by the above-described method includes the side portions including the side surfaces which are substantially perpendicular to the top surface of the oxide insulating layer. Thus, since the width between the upper ends of the trench does not tend to be increased as compared to the width between the side surfaces of the trench, a miniaturized transistor can be provided. Further, the width between the upper ends of the trench is preferably greater than or equal to 1 time and less than or equal to 1.5 times the width between the side surfaces of the trench.

In this embodiment, the first plasma etching treatment in which bias voltage is applied and the second plasma etching treatment in which a bias voltage lower than that of the first plasma etching treatment is applied or bias voltage is not applied are used in combination, so that a trench whose lower corner portions are curved is formed.

The lower corner portions of the trench 131 which is formed here are curved, and its curvature radius is 20 nm to 70 nm, inclusive (preferably, 20 nm to 30 nm, inclusive). The side portions of the trench 131 have side surfaces substantially perpendicular to the top surface of the oxide insulating layer 130, and the width between the upper ends of the trench 131 is preferably greater than or equal to 1 time and less than or equal to 1.5 times the width between the side surfaces of the trench 131. Accordingly, a miniaturized transistor in which a short-channel effect is suppressed can be manufactured.

Figure 2C:
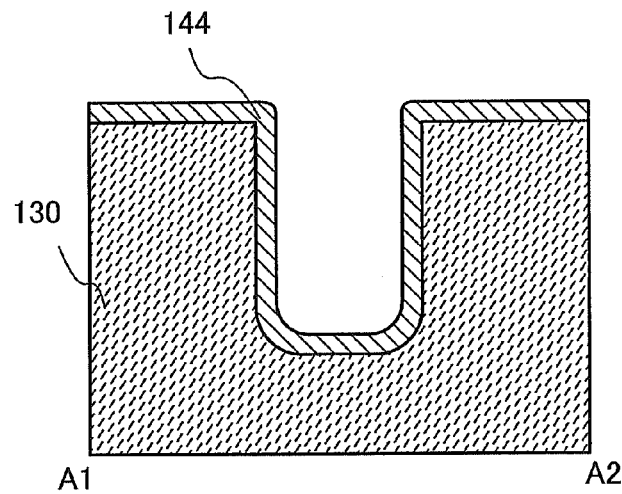

Then, the resist mask 151 is removed by $O_2$ ashing or the like, and the oxide semiconductor film 144 is formed to cover the trench 131 (see FIG. 2C).

An oxide semiconductor to be used for the oxide semiconductor film 144 preferably contains at least indium (In) or zinc (Zn). In particular, In and Zn are preferably contained. As a stabilizer for reducing variation in electric characteristics of a transistor including the oxide, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or Zirconium (Zr) may be contained.

As the oxide semiconductor, for example, any of the following can be used: a one-component metal oxide such as indium oxide, tin oxide, or zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn—O-based oxide" means an oxide containing In, Ga, and Zn as its main component and there is no particular limitation on the ratio of In:Ga:Zn. The In—Ga—Z-based oxide may contain another metal element in addition to In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$. For example, r may be 0.05. The same applies to other oxides.

Note that the oxide semiconductor film 144 is in a single crystal state, a polycrystalline (also referred to as polycrystal) state, an amorphous state, or the like.

The oxide semiconductor film 144 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement when seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°, inclusive. In addition, a simple term "parallel" includes a range from −5° to 5°, inclusive.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when impurities are added to the CAAC-OS film, the crystal part in a region to which the impurities are added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The oxide semiconductor film 144 can be formed by a sputtering method, an evaporation method, a PCVD method, a PLD method, an ALD method, an MBE method, or the like.

The oxide semiconductor film 144 is preferably formed by a sputtering method in an oxygen gas atmosphere at a substrate heating temperature in the range of 100° C. to 600° C., preferably 150° C. to 550° C., and more preferably 200° C. to 500° C. The thickness of the oxide semiconductor film 144 is 1 nm to 40 nm, inclusive, preferably 3 nm to 20 nm, inclusive. As the substrate heating temperature at the time of film formation is higher, the impurity concentration in the obtained oxide semiconductor film 144 is lower. Further, the atomic arrangement in the oxide semiconductor film 144 is ordered and the density of the oxide semiconductor film 144 is increased, so that a polycrystal or a CAAC is easily formed.

Furthermore, when an oxygen gas atmosphere is employed for the deposition, an unnecessary atom such as a rare gas atom is not contained in the oxide semiconductor film 144, so that a polycrystalline oxide semiconductor film or a CAAC-OS film is easily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. It is preferable that argon and oxygen used for formation of the oxide semiconductor film do not contain water, hydrogen, and the like. For example, it is preferable that argon have a purity of 9N, a dew point of −121° C., a water content of 0.1 ppb, and a hydrogen content of 0.5 ppb and oxygen have a purity of 8N, a dew point of −112° C., a water content of 1 ppb, and a hydrogen content of 1 ppb. Note that as the oxide semiconductor film 144 is thinner, a short-channel effect of a transistor is reduced. However, when the oxide semiconductor film 144 is too thin, the oxide semiconductor film 144 is significantly influenced by interface scattering; thus, the field effect mobility might be decreased.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

Note that the average surface roughness ($R_a$) is obtained by expanding, into three dimensions, arithmetic mean surface roughness that is defined by JIS B 0601: 2001 (ISO4287:1997) so as to be able to apply it to a curved surface. $R_a$ can be expressed as an "average value of the absolute values of deviations from a reference surface to a designated surface" and is defined by the formula below.

$$R_a = \frac{1}{S_0} \int_{Y_1}^{Y_2} \int_{X_1}^{X_2} |F(X, Y) - Z_0| dX dY \quad \text{[FORMULA 1]}$$

Here, the designated surface is a surface which is a target of roughness measurement, and is a quadrilateral region which is specified by four points represented by the coordinates $(X_1, Y_1, F(X_1, Y_1))$, $(X_1, Y_2, F(X_1, Y_2))$, $(X_2, Y_1, F(X_2, Y_1))$, and $(X_2, Y_2, F(X_2, Y_2))$. $S_0$ represents the area of a rectangle which is obtained by projecting the designated surface on the X-Y plane, and $Z_0$ represents the height of the reference surface (the average height of the designated surface). $R_a$ can be measured using an atomic force microscope (AFM). The designated surface is a surface where all the measurement data are shown, and the measurement data consists of three parameters (X, Y, Z) and is represented by Z=F (X, Y).

In addition, the reference surface is a surface parallel to an X-Y plane at the average height of the designated surface. In short, when the average value of the height of the designated surface is denoted by $Z_0$, the height of the reference surface is also denoted by $Z_0$.

In order to make the average surface roughness of the oxide insulating layer over which the oxide semiconductor film is formed less than or equal to 0.3 nm, planarization treatment may be performed. The planarization treatment may be performed before the oxide semiconductor film is formed.

For example, as the planarization treatment, chemical mechanical polishing (CMP) treatment may be performed. The CMP treatment may be performed at least once. When the CMP treatment is performed plural times, it is preferable that first polishing be performed at a high polishing rate and final polishing be performed at a low polishing rate.

Note that dry etching or the like may be performed instead of CMP treatment in order to planarize the oxide insulating layer. As an etching gas, a chlorine-based gas such as a chlorine gas, a boron chloride gas, a silicon chloride gas, or a carbon tetrachloride gas, a fluorine-based gas such as a carbon tetrafluoride gas, a sulfur fluoride gas, or a nitrogen fluoride gas, or the like can be used as appropriate.

In this embodiment, in the plasma etching treatment in which the trench is formed in the oxide insulating layer, the oxide insulating layer can be planarized. By the plasma treatment, ions of an inert gas are sputtered onto a process surface so as to planarize minute unevenness on the process surface by the sputtering effect. Such plasma treatment is also referred to as reverse sputtering. In particular, plasma treatment using a rare gas is preferably used for planarizing the oxide insulating layer.

Note that any of the above treatments may be employed in order to planarize the oxide insulating layer. For example, only the reverse sputtering may be performed, or the CMP treatment and then the dry etching may be performed. Note that it is preferable that dry etching or reverse sputtering be used so that water can be prevented from entering the oxide insulating layer over which the oxide semiconductor layer is to be formed.

Note that it is preferable that oxygen be contained in the metal oxide in excess of the amount in the stoichiometric proportion. When oxygen is contained in excess, generation of carriers due to oxygen vacancies in the oxide semiconductor film which is formed can be suppressed.

Note that for example, in the case where the oxide semiconductor film 144 is formed using an In—Zn-based metal oxide, a target has a composition ratio where In/Zn is 1 to 100, preferably 1 to 20, more preferably 1 to 10 in atomic ratio. When the atomic ratio of In to Zn is in the above preferred range, the field-effect mobility can be improved. Here, when the atomic ratio of the metal oxide is In:Zn:O=X:Y:Z, it is preferable to satisfy the relation of Z>1.5X+Y so that excess oxygen is contained.

In the case of forming an In—Ga—Zn—O-based material as the oxide semiconductor film 144 by a sputtering method, it is preferable to use an In—Ga—Zn—O target having the following atomic ratio: the atomic ratio of In:Ga:Zn is 1:1:1, 4:2:3, 3:1:2, 1:1:2, 2:1:3, or 3:1:4. When the oxide semiconductor film 144 is formed using an In—Ga—Zn—O-based target having the aforementioned atomic ratio, a polycrystalline oxide semiconductor film or a CAAC-OS film is likely to be formed.

Further, in the case of forming a film of an In—Sn—Zn—O-based material as the oxide semiconductor film 144 by a sputtering method, it is preferable to use an In—Sn—Zn—O target having an atomic ratio of In:Sn:Zn=1:1:1, 2:1:3, 1:2:2, or 20:45:35. When the oxide semiconductor film 144 is formed using an In—Sn—Zn—O-based target having the aforementioned atomic ratio, a polycrystalline oxide semiconductor film or a CAAC-OS is likely to be formed.

Note that the filling factor of the target is 90% to 100%, inclusive, preferably 95% to 99.9%, inclusive. With a high filling factor, a dense oxide semiconductor film can be formed.

Note that the energy gap of a metal oxide which can be applied to the oxide semiconductor film is preferably greater than or equal to 2 eV, more preferably greater than or equal to 2.5 eV, still more preferably greater than or equal to 3 eV. In this manner, the off-state current of a transistor can be reduced by using a metal oxide having a wide band gap.

Note that the oxide semiconductor film contains hydrogen. Note that the hydrogen may be contained in the form of a hydrogen molecule, water, a hydroxyl group, or hydride in some cases, in addition to a hydrogen atom. It is preferable that the amount of hydrogen contained in the oxide semiconductor film be as small as possible.

Note that the concentrations of an alkali metal and an alkaline earth metal in the oxide semiconductor film are preferably low, and these concentrations are preferably lower than or equal to $1\times10^{18}$ atoms/cm$^3$, more preferably lower than or equal to $2\times10^{16}$ atoms/cm$^3$. When an alkali metal and an alkaline earth metal are bonded to an oxide semiconductor, carriers may be generated, which causes increase in the off-state current of the transistor.

Note that when heat treatment is performed on the oxide semiconductor film, the impurity concentration can be reduced. The heat treatment is performed in a reduced pressure atmosphere, an inert atmosphere, or an oxidation atmosphere.

The heat treatment is preferably performed in such a manner that after heat treatment is performed in a reduced pressure atmosphere or an inert atmosphere, the atmosphere is switched to an oxidation atmosphere with the temperature maintained and heat treatment is further performed. By the heat treatment in a reduced pressure atmosphere or an inert gas atmosphere, the impurity concentration in the oxide semiconductor film 144 can be reduced; however, at the same time, oxygen vacancies are generated. The oxygen vacancies generated at this time can be reduced by the heat treatment in an oxidizing atmosphere.

By performing heat treatment in addition to the substrate heating at the time of film formation on the oxide semiconductor film 144, the impurity levels in the film can be significantly reduced. As a result, the field-effect mobility of the transistor can be increased to close to the ideal field-effect mobility.

Note that when heat treatment is performed while the oxide semiconductor film 144 is provided over the oxide insulating layer 130, oxygen can be supplied to the oxide semiconductor film 144, the oxygen defects in the oxide semiconductor film 144 can be reduced, and semiconductor characteristics can be improved. The oxide semiconductor film 144 and the oxide insulating layer 130 may be subjected to a heating step in a state where the oxide semiconductor film 144 and the oxide insulating layer 130 are at least partly in contact with each other so that oxygen is supplied to the oxide semiconductor film 144.

Oxygen (including at least any one of oxygen radicals, oxygen atoms, and oxygen ions) may be introduced into the oxide semiconductor film 144 in order to supply oxygen to the film. Oxygen can be introduced by an ion implantation method, an ion doping method, a plasma immersion ion implantation method, plasma treatment, or the like. Oxygen may be introduced directly into the oxide semiconductor film 144 in an exposed state, or through the gate insulating layer 146 or the like.

Note that the oxide semiconductor film 144 may be processed into an island shape or may be used as it is. In addition, an element isolation region formed using an insulating layer may be provided to isolate the oxide semiconductor film for each element. A trench structure can be employed for the element isolation region.

Note that in the case where the oxide semiconductor film 144 is processed into an island shape, etching of the oxide semiconductor film 144 may be dry etching, wet etching, or both dry etching and wet etching. As an etchant used for wet etching of the oxide semiconductor film 144, for example, a mixed solution of phosphoric acid, acetic acid, and nitric acid, or the like can be used. In addition, ITO-07N (produced by KANTO CHEMICAL CO., INC.) may be used.

Then, a conductive film used for forming a source electrode and a drain electrode is formed over the oxide semiconductor film 144. The conductive film is formed using a material that can withstand heat treatment in a later step. As the conductive material used for forming the source electrode and the drain electrode, it is possible to use, for example, metal containing an element selected from Al, Cr, Cu, Ta, Ti, Mo, and W, metal nitride containing any of these elements as its component (titanium nitride, molybdenum nitride, or tungsten nitride), or the like. Alternatively, a film of a high-melting-point metal such as Ti, Mo, or W or a metal nitride film thereof (titanium nitride, molybdenum nitride, or tungsten nitride) may be formed over or/and below a metal film such as an Al film or a Cu film. Further alternatively, the conductive film used for forming the source electrode and the drain electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$), indium zinc oxide ($In_2O_3$—ZnO), or any of the metal oxide containing silicon oxide can be used.

A resist mask is formed over the conductive film through a photolithography process, the conductive layer 142a and the conductive layer 142b serving as the source electrode and the drain electrode are formed by selective etching, and then, the resist mask is removed.

In this embodiment, since a Ti film is used as the conductive film and an In—Ga—Zn—O-based oxide semiconductor film is used for the oxide semiconductor film 144, an ammonia hydrogen peroxide mixture (a mixture of ammonia, water, and hydrogen peroxide) is used as an etchant.

Note that in this embodiment, the conductive layer 142a and the conductive layer 142b which are to be the source electrode and the drain electrode are provided after the oxide semiconductor film 144 is formed, and the conductive layer 142a is in contact with the conductive layer 142b on the top surface of the oxide semiconductor film 144. However, the semiconductor device of one embodiment of the present invention is not limited thereto, and a structure in which the conductive layer 142a and the conductive layer 142b are provided before the oxide semiconductor film 144 is formed and the conductive layer 142a is in contact with the conductive layer 142b on the under surface of the oxide semiconductor film 144 may be used. In this case, the conductive layer 142a and the conductive layer 142b are preferably tapered in order to improve the coverage with the oxide semiconductor film.

Then, the gate insulating layer 146 is formed so as to cover part of the oxide semiconductor film 144 and the conductive layers 142a and 142b functioning as the source electrode and the drain electrode. The gate insulating layer 146 is also formed on the side portions and the bottom portion of the trench in the channel width direction (see FIG. 3A).

The gate insulating layer 146 can have a thickness of 1 nm to 100 nm, inclusive, and can be formed by a sputtering method, an MBE method, a CVD method, a pulsed laser deposition method, an ALD method, or the like as appropriate. The gate insulating layer 146 may be formed using a sputtering apparatus which performs film formation with surfaces of a plurality of substrates set substantially perpendicular to a surface of a sputtering target.

When the gate insulating layer 146 is formed using a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)), or lanthanum oxide, gate leakage current can be reduced. Further, the gate insulating layer 146 may have a single-layer structure or a stacked structure.

Figure 3A:
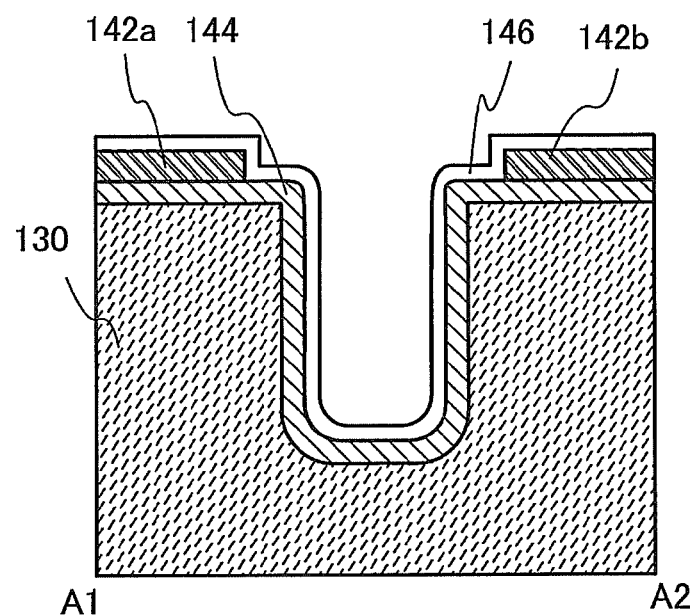
FIGS. 3A and 3B illustrate a manufacturing method of a semiconductor device of one embodiment of the present invention.
Figure 3B:
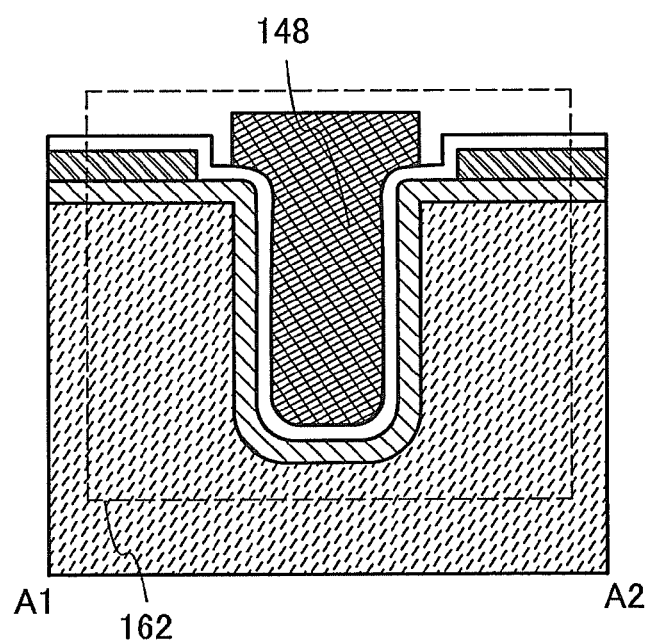

Then, a conductive layer to be the gate electrode 148 is formed over the gate insulating layer 146 to fill the trench, so that the gate electrode 148 is formed over the gate insulating layer 146 (see FIG. 3B). The gate electrode 148 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with impurity elements such as phosphorus, or a silicide film such as a nickel silicide film may be used as the gate electrode 148. The gate electrode 148 may have a single-layer structure or a stacked structure.

The gate electrode 148 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode 148 has a stacked structure of the above conductive material and the above metal material.

As one layer of the gate electrode 148 which is in contact with the gate insulating layer 146, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the transistor to be positive when used as the gate electrode layer. Accordingly, a so-called normally off switching element can be provided.

With the above steps, the transistor 162 is formed.

Figure 4A:
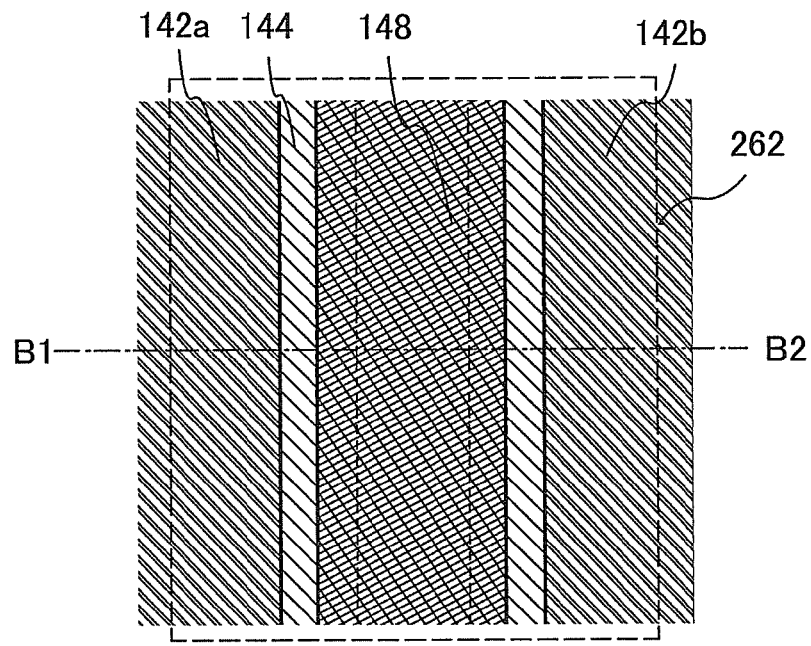
FIGS. 4A and 4B are a top view and a cross-sectional view, respectively, illustrating a semiconductor device of one embodiment of the present invention.
Figure 4B:
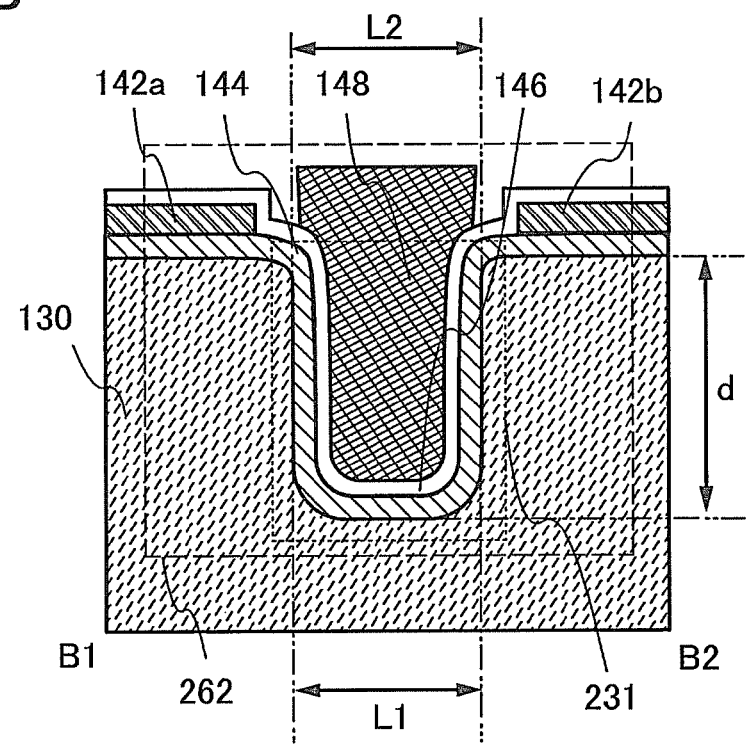

Note that as illustrated in FIGS. 4A and 4B, the transistor 162 may include a trench 231 whose lower corner portions and upper corner portions are curved. Here, a manufacturing method of the trench 231 whose lower corner portions and upper corner portions are curved is described.

The method for forming the trench 231 is similar to that for the trench 131 until the step of forming the trench 131 whose lower corner portions are curved in the oxide insulating layer 130. Then, plasma etching treatment (third plasma etching treatment) using a rare gas is performed on the trench, so that the upper corner portions of the trench 131 are also curved. Accordingly, the trench 231 whose lower corner portions and upper corner portions are curved can be formed.

The third plasma etching treatment is performed on the oxide insulating layer 130 in which the trench 131 is provided, with the use of rare gas elements preferably having large mass such as argon, krypton, or xenon. The conditions for the third plasma treatment may be set as appropriate depending on the material for the oxide insulating layer 130, the shape of the trench 131, or the like so that at least the upper corner portions are curved with a curvature radius of 20 nm to 60 nm, inclusive.

For example, as an example of the conditions for the third plasma treatment which is performed on an insulating layer formed of a silicon oxide film, the third plasma treatment can be performed with an argon gas (Ar=100 sccm), an electronic power of 500 W, a bias power of 100 W, a pressure of 1.35 Pa, and a substrate temperature of −10° C. for 180 seconds.

By performing the third plasma etching treatment, a trench whose lower corner portions and upper corner portions are curved can be formed, so that the coverage with the oxide semiconductor film 144 which is provided over the oxide insulating layer 130 is improved. Accordingly, a transistor with stable electronic characteristics can be provided.

Although not illustrated, an insulating layer may be provided over the transistor 162. As the insulating layer, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

An insulating layer may be additionally stacked over the insulating layer. Particularly in the case where an oxide insulating layer is used as the insulating layer, it is preferable to form a protective insulating layer for preventing impurities such as moisture and hydrogen entering from the outside into the oxide semiconductor film 144. For the protective insulating layer, an inorganic insulating layer, examples of inorganic insulating materials are silicon nitride, aluminum oxide, silicon nitride oxide, aluminum nitride, and aluminum nitride oxide, may be used. For example, an aluminum oxide film having a high shielding effect (blocking effect), which is not permeable to either oxygen or impurities such as hydrogen and moisture, can be used.

A heating step may be additionally performed after the insulating layer is formed. For example, the heating step may be performed at a temperature of 100° C. to 200° C., inclusive, in the air for 1 hour to 30 hours, inclusive. This heating step may be performed at a fixed heating temperature. Alternatively, the following change in the heating temperature may be conducted plural times repeatedly: the heating temperature is increased from room temperature to a temperature of 100° C. to 200° C., inclusive, and then decreased to room temperature.

In addition, a planarization insulating film may be formed in order to reduce surface unevenness due to the transistor 162. As the planarization insulating film, an organic material such as a polyimide resin, an acrylic resin, or a benzocyclobutene-based resin can be used. Other than such organic materials, it is also possible to use a low dielectric constant material (low-k material) or the like. Note that the planarization insulating film may be formed by stacking a plurality of insulating films formed using any of these materials.

The semiconductor device described in this embodiment has a trench structure and a transistor is formed in the trench structure, so that the semiconductor device can have a long channel length in the depth direction. Accordingly, a miniaturized transistor in which a short-channel effect is suppressed can be provided. Further, the upper corner portions and the lower corner portions of the trench are formed to be curved, which leads to improvement of the coverage with the oxide semiconductor film. Accordingly, a semiconductor device with stable electronic characteristics can be provided.

Further, since the width between the upper ends of the trench is greater than or equal to 1 time and less than or equal to 1.5 times the width between the side surfaces of the trench, a miniaturized transistor including a trench can be manufactured.

Note that this embodiment can be combined with any of the other embodiments as appropriate.

Embodiment 2

In this embodiment, an example of a semiconductor device which includes the transistor 162 described in Embodiment 1, which can hold stored data even when not powered, and which has an unlimited number of write cycles is described with reference to drawings.

Since the off-state current of the transistor 162 is small, stored data can be held for a long time with the transistor. In other words, it is possible to obtain a semiconductor memory device which does not require refresh operation or has an extremely low frequency of the refresh operation, which leads to a sufficient reduction in power consumption.

Figure 5A:
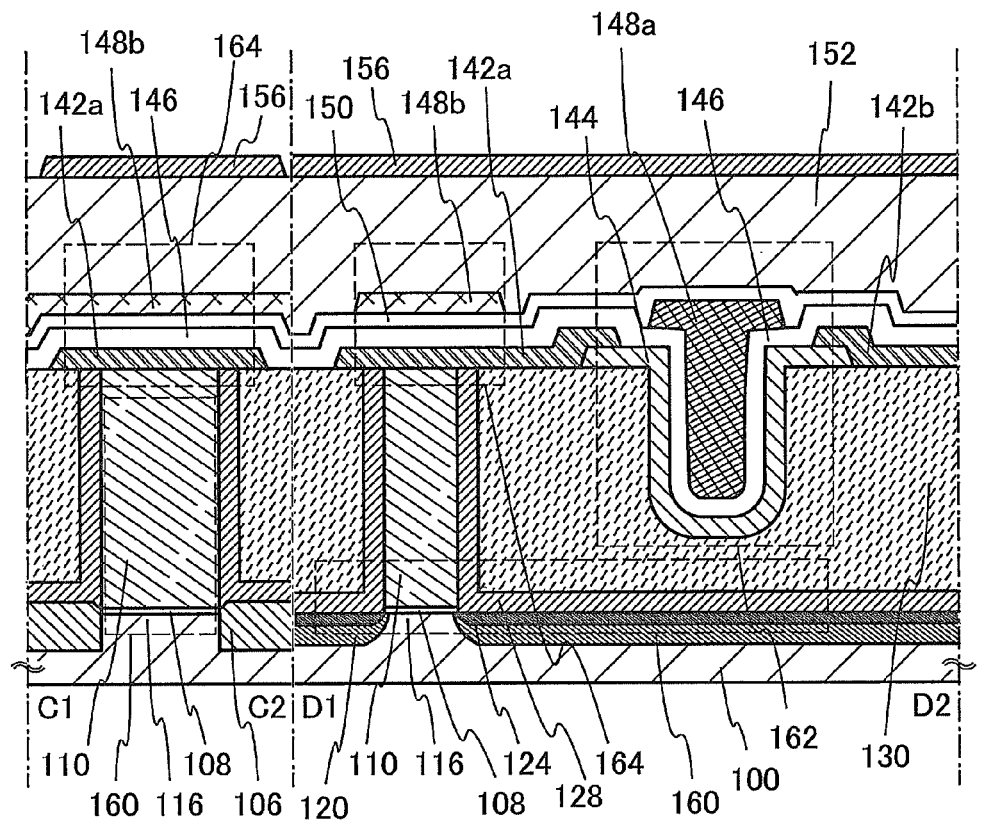
FIGS. 5A to 5C are a cross-sectional view, a plan view, and a circuit diagram, respectively, illustrating a semiconductor device of one embodiment of the present invention.
Figure 5B:
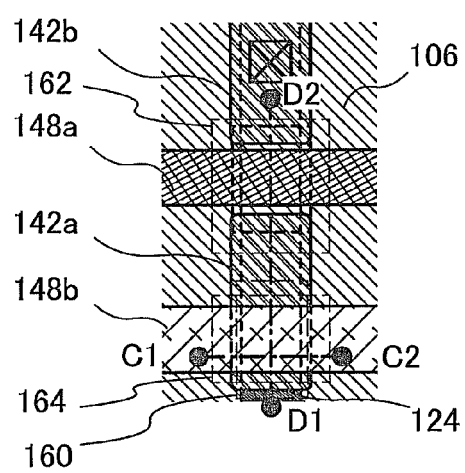
Figure 5C:
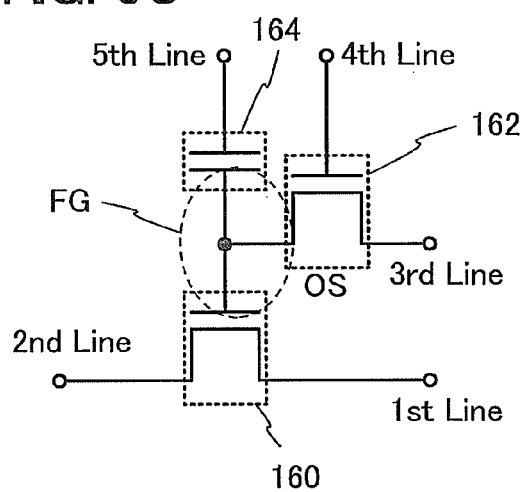

FIGS. 5A to 5C illustrate an example of a structure of the semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section along line C1-C2 and line D1-D2 in FIG. 5B.

The semiconductor device illustrated in FIGS. 5A and 5B includes a transistor 160 including a first semiconductor material in a lower portion, and a transistor 162 including a second semiconductor material in an upper portion. The transistor 162 has the same structure as that described in Embodiment 1; thus, for description of FIGS. 5A and 5B, the same reference numerals are used for the same parts as those in FIGS. 1A and 1B.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. A transistor including a material other than an oxide semiconductor material can operate at high speed easily. On the other hand, charge can be held in a transistor including an oxide semiconductor for a long time owing to its characteristics.

Although both of the above transistors are n-channel transistors in the following description, it is needless to say that p-channel transistors can be used. The technical nature of the disclosed invention is to use an oxide semiconductor in the transistor 162 in order to hold data. Therefore, it is not necessary to limit a specific structure of the semiconductor device, such as a material of the semiconductor device or a structure of the semiconductor device, to the structure described here.

The transistor 160 in FIG. 5A includes a channel formation region 116 provided in a substrate 100 including a semiconductor material (such as silicon), impurity regions 120 provided such that the channel formation region 116 is sandwiched therebetween, metal compound regions 124 provided in contact with the impurity regions 120, a gate insulating layer 108 provided over the channel formation region 116, and a gate electrode 110 provided over the gate insulating layer 108.

Although not illustrated in FIGS. 5A to 5C, part of the metal compound region 124 of the transistor 160 is connected to electrodes. Here, the electrodes serve as a source electrode and a drain electrode of the transistor 160. Further, an element isolation insulating layer 106 is formed on the substrate 100 so as to surround the transistor 160, and an insulating layer 128 and the oxide insulating layer 130 are formed so as to cover the transistor 160. Note that for higher integration, it is preferable that, as in FIG. 5A, the transistor 160 does not have a sidewall insulating layer. On the other hand, when the characteristics of the transistor 160 have priority, the sidewall insulating layer may be formed on a side surface of the gate electrode 110 and the impurity regions 120 may include a region having a different impurity concentration.

The transistor 162 is provided over the transistor 160. Note that the transistor 162 has a similar structure to the transistor described in the above embodiment; thus, detailed description is omitted.

The transistor 162 has a trench structure and includes the oxide semiconductor film 144. When a transistor having a trench structure is used, a short-channel effect can be suppressed. Further, a transistor of one embodiment of the present invention includes the side portions of the trench which have side surfaces substantially perpendicular to the top surface of the oxide insulating layer, and since the width between the upper ends of the trench is greater than or equal to 1 time and less than or equal to 1.5 times the width between the side surfaces of the trench, a miniaturized transistor in which the width between the upper ends of the trench is made small can be manufactured; thus, a semiconductor device can be highly integrated.

An insulating layer 150 having a single-layer structure or a stacked-layer structure is provided over the transistor 162. In addition, a conductive layer 148b is provided in a region overlapping with the conductive layer 142a of the transistor 162 with the gate insulating layer 146 and the insulating layer 150 interposed therebetween, and the conductive layer 142a, the gate insulating layer 146, the insulating layer 150, and the conductive layer 148b form a capacitor 164. That is, the conductive layer 142a of the transistor 162 functions as one electrode of the capacitor 164, and the conductive layer 148b functions as the other electrode of the capacitor 164. Note that in the case where no capacitor is needed, a structure in which the conductive layer 148b is not provided is also possible. Alternatively, the capacitor 164 may be separately provided above the transistor 162. For example, a trench-type capacitor or a stack-type capacitor may be separately formed above the transistor 162 or below the transistor 160 so as to be three-dimensionally stacked, whereby the degree of integration may be further increased.

An insulating layer 152 is provided over the transistor 162 and the capacitor 164. In addition, a wiring 156 for connecting the transistor 162 to another transistor is provided over the insulating layer 152. Although not illustrated in FIG. 5A, the wiring 156 is electrically connected to the conductive layer 142b through an electrode formed in an opening provided in the insulating layer 150, the insulating layer 152, and the like. Here, the electrode is preferably provided so as to partly overlap with at least the oxide semiconductor film 144 of the transistor 162.

In FIGS. 5A and 5B, the transistors 160 and 162 are provided so as to at least partly overlap with each other, and the source region or the drain region of the transistor 160 is preferably provided to partly overlap with the oxide semiconductor film 144. In addition, the transistor 162 and the capacitor 164 are provided so as to overlap with at least part of the transistor 160. When such a planar layout is employed, the area occupied by the semiconductor device can be reduced; thus, the degree of integration can be increased.

Note that the metal compound region 124, the conductive layer 142b, and the wiring 156 may be directly electrically connected to one another, or may be electrically connected to one another through an electrode provided in the insulating layers which are provided among the metal compound region 124, the conductive layer 142b, and the wiring 156. Alternatively, the electrical connection may be established through a plurality of electrodes.

Next, an example of a circuit configuration corresponding to FIGS. 5A and 5B is illustrated in FIG. 5C.

In FIG. 5C, a first wiring (1st Line) is electrically connected to a source electrode of the transistor 160. A second wiring (2nd Line) is electrically connected to the drain electrode of the transistor 160. A third wiring (3rd Line) is electrically connected to one of source and drain electrodes of the transistor 162, and a fourth wiring (4th Line) is electrically connected to a gate electrode of the transistor 162. A gate electrode of the transistor 160 and the other of the source and drain electrodes of the transistor 162 are electrically connected to one electrode of the capacitor 164. A fifth wiring (5th Line) is electrically connected to the other electrode of the capacitor 164.

The semiconductor device in FIG. 5C utilizes a characteristic in which the potential of the gate electrode of the transistor 160 can be held, and thus enables data writing, holding, and reading as follows.

Writing and holding of data are described. First, the potential of the fourth wiring is set to a potential at which the transistor 162 is turned on, so that the transistor 162 is turned on. Accordingly, the potential of the third wiring is supplied to the gate electrode of the transistor 160 and to the capacitor 164. That is, predetermined charge is supplied to the gate electrode of the transistor 160 (writing). Here, one of two kinds of charges providing different potential levels (hereinafter referred to as a low-level charge and a high-level charge) is applied. After that, the potential of the fourth wiring is set to a potential at which the transistor 162 is turned off, so that the transistor 162 is turned off. Thus, the charge supplied to the gate electrode of the transistor 160 is held (holding).

Since the off-state current of the transistor 162 is significantly small, the charge of the gate electrode of the transistor 160 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held at the gate electrode of the transistor 160. This is because in general, when the transistor 160 is an n-channel transistor, an apparent threshold voltage $V_{th\_H}$ in the case where the high-level charge is given to the gate electrode of the transistor 160 is lower than an apparent threshold voltage $V_{th\_L}$ in the case where the low-level charge is given to the gate electrode of the transistor 160. Here, an apparent threshold voltage refers to the potential of the fifth wiring which is needed to turn on the transistor 160. Thus, the potential of the fifth wiring is set to a potential $V_0$ which is between $V_{th\_H}$ and $V_{th\_L}$, whereby charge supplied to the gate electrode of the transistor 160 can be determined. For example, in the case where the high-level charge is supplied in writing, when the potential of the fifth wiring is $V_0$ ($>V_{th\_H}$), the transistor 160 is turned on. In the case where the low-level charge is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed, it is necessary that data of only a desired memory cell can be read. In such a case in which data is not read, the fifth wirings may be supplied with a potential at which the transistor 160 is turned off regardless of the state of the gate electrode, that is, a potential lower than $V_{th\_H}$. Alternatively, the fifth wirings may be supplied with a potential at which the transistor 160 is turned on regardless of the state of the gate electrode, that is, a potential higher than $V_{th\_L}$.

When including a transistor having a channel formation region formed using an oxide semiconductor and having extremely small off-state current, the semiconductor device described in this embodiment can hold data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention does not have a limitation on the number of times data can be rewritten, which is a problem of a conventional nonvolatile memory, and the reliability thereof is drastically improved. Furthermore, since data is written by turning on or off the transistors, high-speed operation can be easily realized.

In addition, by employing a trench structure for the semiconductor device described in this embodiment, the planar area of the semiconductor device can be reduced, so that higher integration can be achieved. Further, in the semiconductor device described in this embodiment, since an oxide semiconductor film is formed along the trench, a channel length can be secured even when the transistor is a highly integrated transistor; thus, a semiconductor device in which a short channel effect is suppressed can be provided. Further, side portions of the trench have side surfaces substantially perpendicular to the top surface of the oxide insulating layer, and since the width between the upper ends of the trench is greater than or equal to 1 time and less than or equal to 1.5 times the width between the side surfaces of the trench, a miniaturized transistor in which the width of the trench is made small can be manufactured; thus, the semiconductor device can be further highly integrated.

The configuration, method, and the like described in this embodiment can be combined as appropriate with any of the configurations, methods, and the like described in the other embodiments.

Embodiment 3

In this embodiment, a semiconductor device which includes the transistor 162 described in Embodiment 1, which can hold stored data even when not powered, which has an unlimited number of write cycles, and which has a structure different from the structure described in Embodiment 2 is described with reference to FIGS. 6A and 6B and FIGS. 7A and 7B.

Figure 6A:
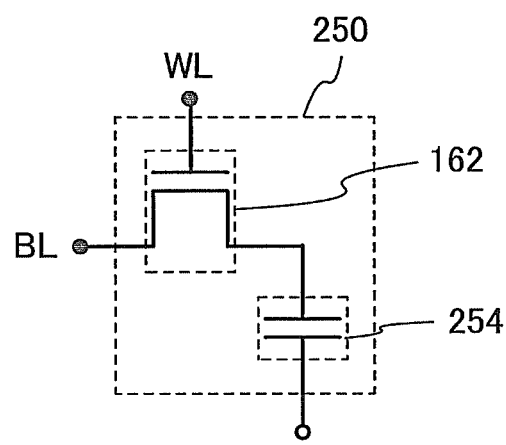
FIGS. 6A and 6B are a circuit diagram and a perspective view illustrating a semiconductor device of one embodiment of the present invention.
Figure 6B:
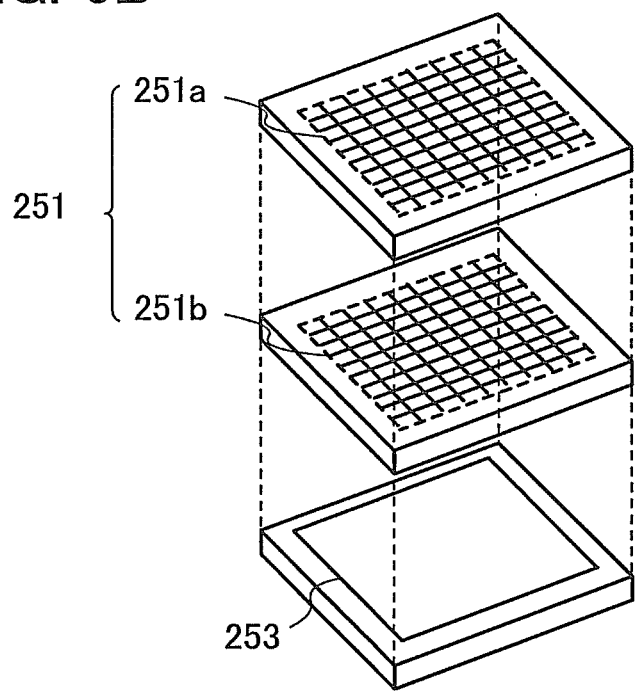

FIG. 6A illustrates an example of a circuit configuration of a semiconductor device, and FIG. 6B is a conceptual diagram illustrating an example of a semiconductor device. First, the semiconductor device illustrated in FIG. 6A is described, and then, the semiconductor device illustrated in FIG. 6B is described.

In the semiconductor device illustrated in FIG. 6A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

The transistor 162 including an oxide semiconductor has a characteristic of a significantly small off-state current. For that reason, a potential of the first terminal of the capacitor 254 (or a charge accumulated in the capacitor 254) can be held for an extremely long period by turning off the transistor 162.

Next, writing and holding of data in the semiconductor device (a memory cell 250) illustrated in FIG. 6A are described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the charge at the first terminal of the capacitor 254 is held (holding).

Since the off-state current of the transistor 162 is extremely small, the potential of the first terminal of the capacitor 254 (or the charge accumulated in the capacitor) can be held for a long time.

Next, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely small. In other words, refresh operation becomes unnecessary or the frequency of the refresh operation can be extremely lowered, which leads to a sufficient reduction in power consumption. Moreover, stored data can be held for a long period even when power is not supplied.

Next, the semiconductor device illustrated in FIG. 6B is described.

The semiconductor device illustrated in FIG. 6B includes a memory cell array 251 (memory cell arrays 251a and 251b) including a plurality of memory cells 250 illustrated in FIG. 6A as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 6B, the peripheral circuit 253 can be provided under the memory cell array 251 (the memory cell arrays 251a and 251b). Thus, the size of the semiconductor device can be decreased.

A transistor provided in the peripheral circuit 253 is preferably formed using a semiconductor material which is different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 6B illustrates, as an example, the semiconductor device in which two memory cell arrays 251 (the memory cell array 251a and the memory cell array 251b) are stacked; however, the number of memory cell arrays to be stacked is not limited thereto. Three or more memory cell arrays may be stacked.

Next, a specific structure of the memory cell 250 illustrated in FIG. 6A is described with reference to FIGS. 7A and 7B.

Figure 7A:
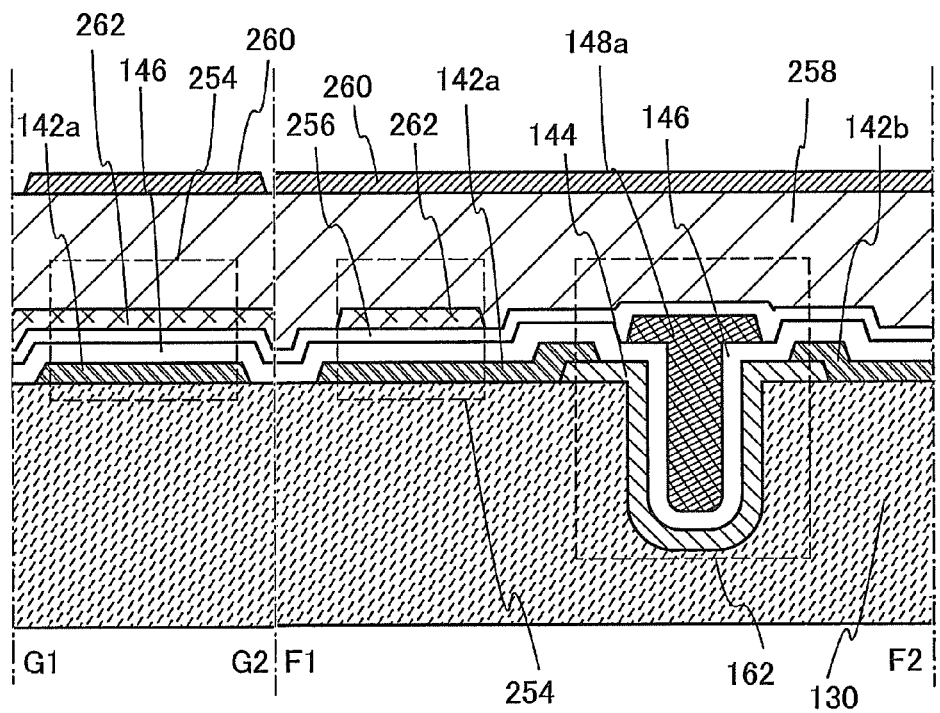
FIGS. 7A and 7B are a cross-sectional view and a plan view illustrating a semiconductor device of one embodiment of the present invention.
Figure 7B:
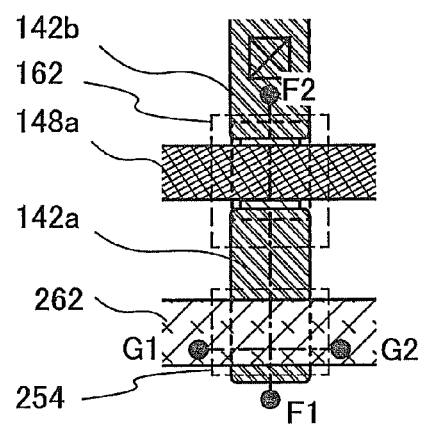

FIGS. 7A and 7B illustrate an example of a structure of the memory cell 250. FIG. 7A is a cross-sectional view of the memory cell 250, and FIG. 7B is a plan view of the memory cell 250. Here, FIG. 7A illustrates a cross section taken along line F1-F2 and line G1-G2 in FIG. 7B.

The transistor 162 illustrated in FIGS. 7A and 7B has the same structure as that described in Embodiment 1; thus, the same reference numerals are used for the same parts as those in FIGS. 1A and 1B, and the description thereof is omitted.

An insulating layer 256 having a single-layer structure or a stacked-layer structure is provided over the transistor 162. In addition, a conductive layer 262 is provided in a region overlapping with the conductive layer 142a of the transistor 162 with the insulating layer 256 interposed therebetween, and the conductive layer 142a, the insulating layer 256, and the conductive layer 262 form a capacitor 254. That is, the conductive layer 142a of the transistor 162 functions as one electrode of the capacitor 254, and the conductive layer 262 functions as the other electrode of the capacitor 254.

An insulating layer 258 is provided over the transistor 162 and the capacitor 254. In addition, a wiring 260 for connecting the memory cell 250 to an adjacent memory cell 250 is provided over the insulating layer 258. Although not illustrated, the wiring 260 is electrically connected to the conductive layer 142b of the transistor 162 through an opening provided in the insulating layer 256, the insulating layer 258, and the like. The wiring 260 may be electrically connected to the conductive layer 142b through another conductive layer provided in the opening. Note that the wiring 260 corresponds to the bit line BL in the circuit diagram of FIG. 6A.

In FIGS. 7A and 7B, the conductive layer 142b of the transistor 162 can also function as a source electrode of a transistor included in an adjacent memory cell. When such a planar layout is employed, the area occupied by the semiconductor device can be reduced; thus, the degree of integration can be increased.

As described above, the plurality of memory cells in the upper portion is formed with the transistors including an oxide semiconductor. Since the off-state current of the transistor including an oxide semiconductor is small, stored data can be held for a long time owing to such a transistor. In other words, the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently reduced). In addition, with a structure where the peripheral circuit and the memory circuit are stacked, the degree of integration of the semiconductor device can be increased.

In addition, by employing the trench structure for a semiconductor device described in this embodiment, the planar area of the semiconductor device can be reduced, so that higher integration can be achieved. Further, in the semiconductor device described in this embodiment, since an oxide semiconductor film is formed along the trench, a channel length can be secured even when a transistor is highly integrated; thus, a semiconductor device in which a short channel effect is suppressed can be provided. Further, side portions of the trench have side surfaces substantially perpendicular to the top surface of the oxide insulating layer, and since the width between the upper ends of the trench is greater than or equal to 1 time and less than or equal to 1.5 times the width between the side surfaces of the trench, a miniaturized transistor in which the width of the trench is made small can be manufactured; thus, a semiconductor device can be further highly integrated.

This embodiment can be implemented in appropriate combinations with any of the configurations described in the other embodiments.

Embodiment 4

In this embodiment, examples of application of the semiconductor device described in any of the above embodiments to portable devices such as cellular phones, smartphones, or electronic books are described with reference to FIGS. 8A and 8B, FIG. 9, FIG. 10, and FIG. 11.

In a portable device such as a cellular phone, a smartphone, or an electronic book, an SRAM or a DRAM is used so as to store image data temporarily. The reason why an SRAM or a DRAM is used is that a flash memory is slow in responding and is not suitable for image processing. On the other hand, an SRAM or a DRAM has the following characteristics when used for temporary storage of image data.

Figure 8A:
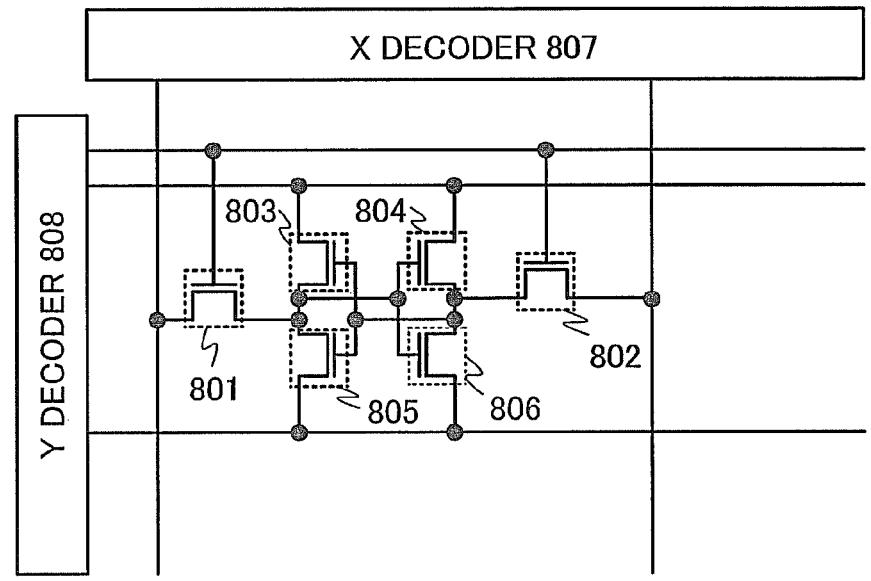
FIGS. 8A and 8B are circuit diagrams each illustrating a semiconductor device of one embodiment of the present invention.

In an ordinary SRAM, as illustrated in FIG. 8A, one memory cell includes six transistors, that is, transistors 801 to 806, which are driven with an X decoder 807 and a Y decoder 808. The transistor 803 and the transistor 805, and the transistor 804 and the transistor 806 form inverters, which enables high-speed driving. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, the price per bit of an SRAM is the most expensive among a variety of memory devices.

Figure 8B:
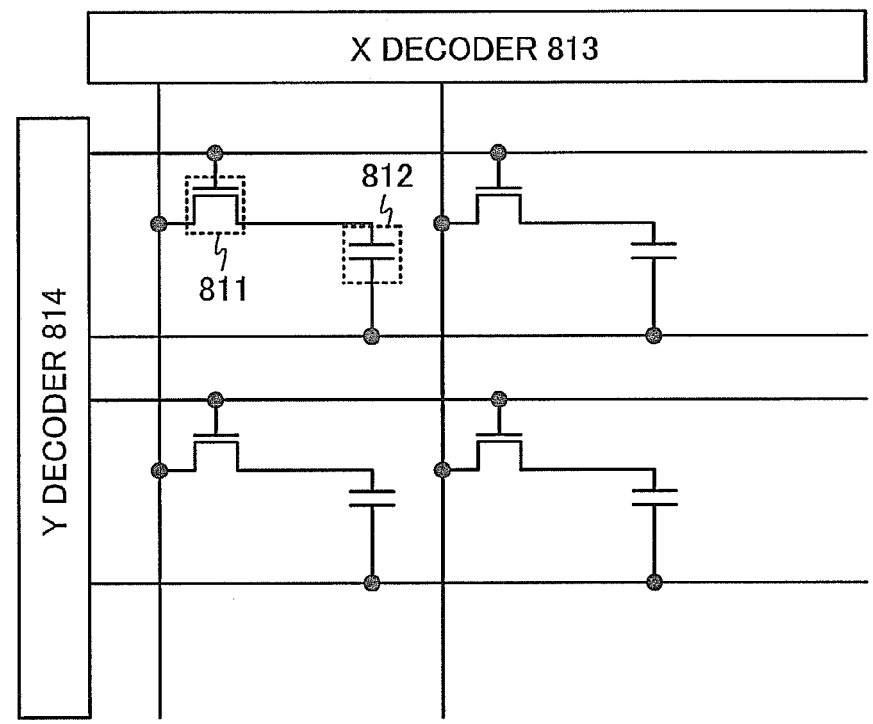

In a DRAM, as illustrated in FIG. 8B, a memory cell includes a transistor 811 and a storage capacitor 812, which are driven with an X decoder 813 and a Y decoder 814. One cell is configured with one capacitor for one transistor and has a small area. The area of a memory cell in a DRAM is generally 10 $F^2$ or less. Note that the DRAM needs to be refreshed periodically and consumes electric power even when a rewriting operation is not performed.

On the other hand, the memory cell of the semiconductor device described in any of the above embodiments has an area of approximately 10 $F^2$ and does not need to be refreshed frequently. Therefore, the area of a memory cell can be decreased, and power consumption can be reduced.

Figure 9:
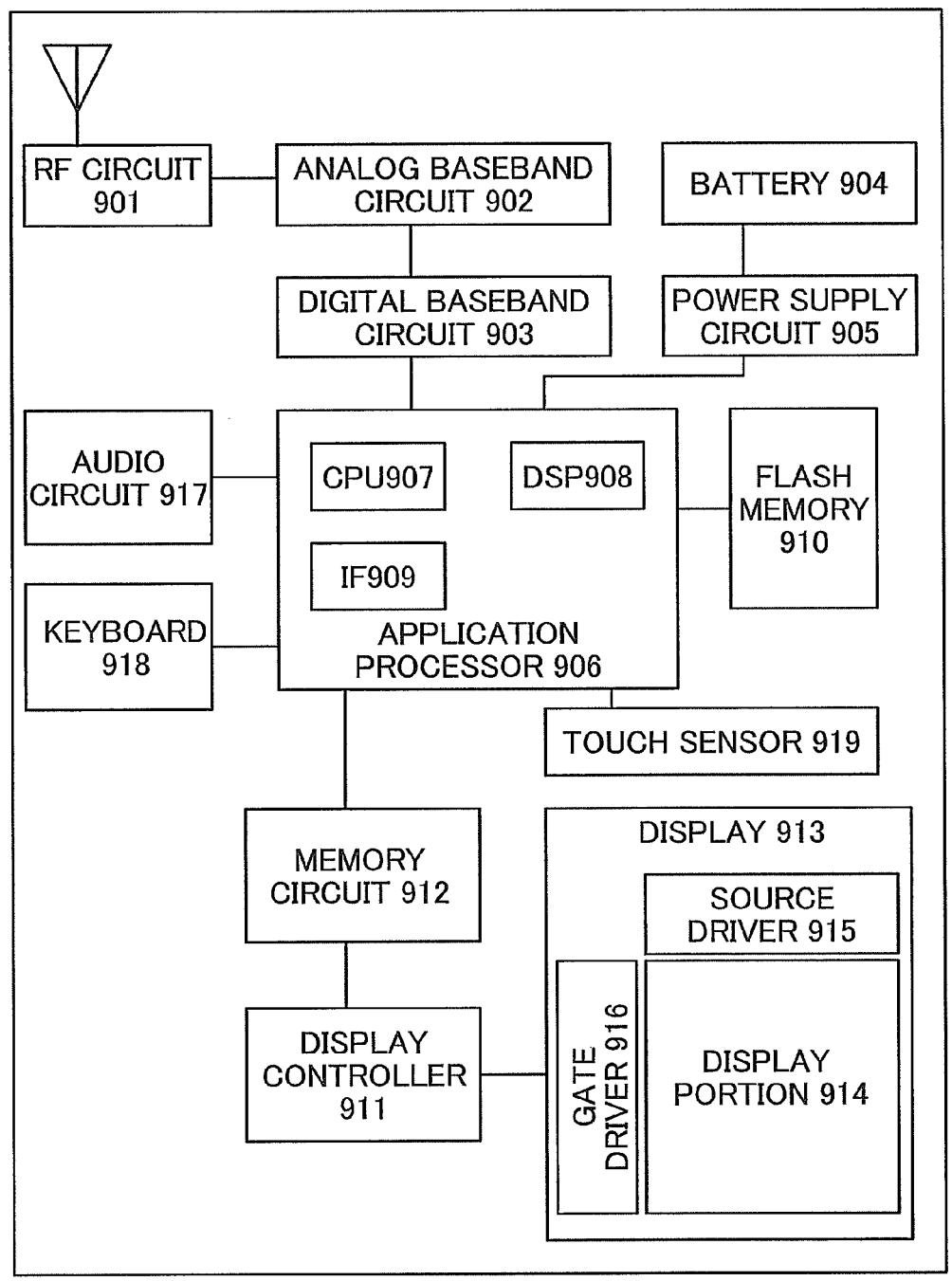
FIG. 9 is a block diagram illustrating an example of a semiconductor device of one embodiment of the present invention.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM. By employing the semiconductor device described in any of the above embodiments for that portion, data can be written and read at high speed and can be held for a long time, and power consumption can be sufficiently reduced.

Figure 10:
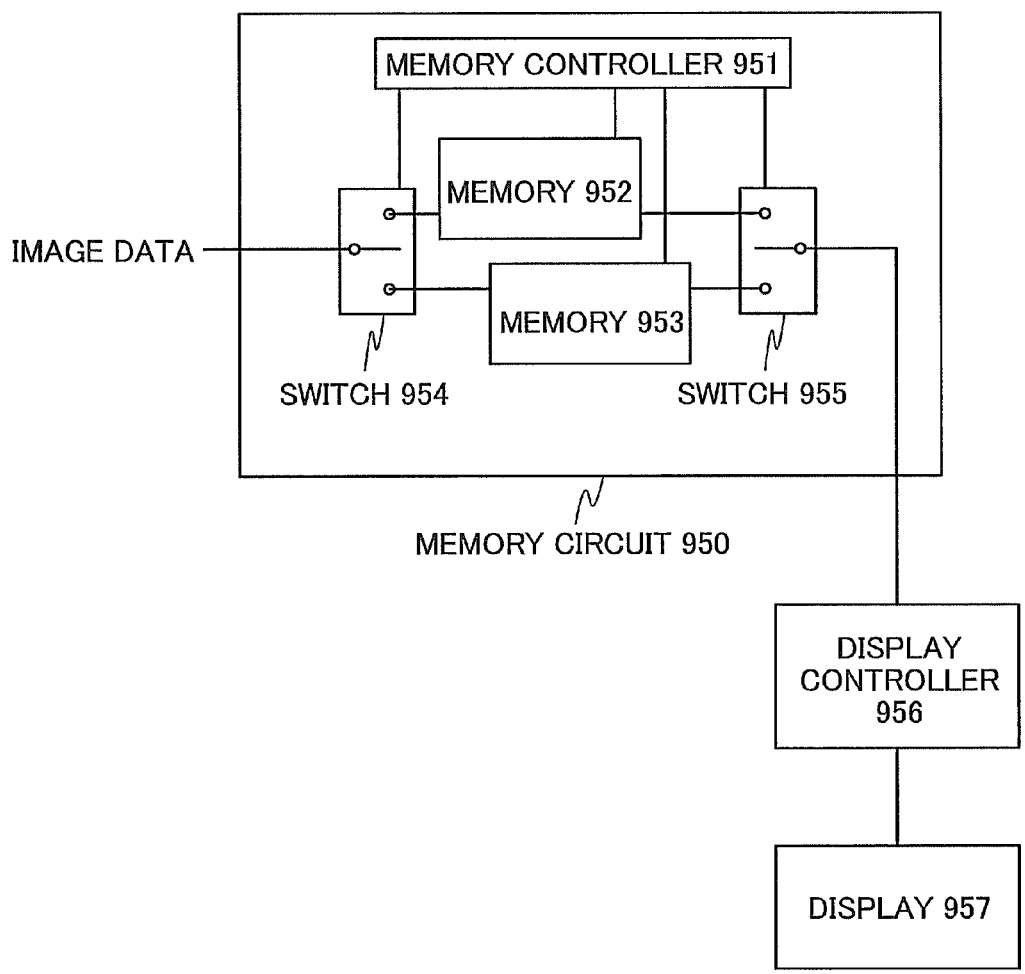
FIG. 10 is a block diagram illustrating an example of a semiconductor device of one embodiment of the present invention.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller

951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is produced by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

When the input image data A remains unchanged, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during that time, the stored image data A is regularly read from the memory 952 through the switch 955. After the completion of storing the new image data (stored image data B) in the memory 953, from the next frame for the display 957, the stored image data B starts to be read, transmitted to the display 957 through the switch 955 and the display controller 956, and displayed on the display 957. This reading operation continues until the next new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
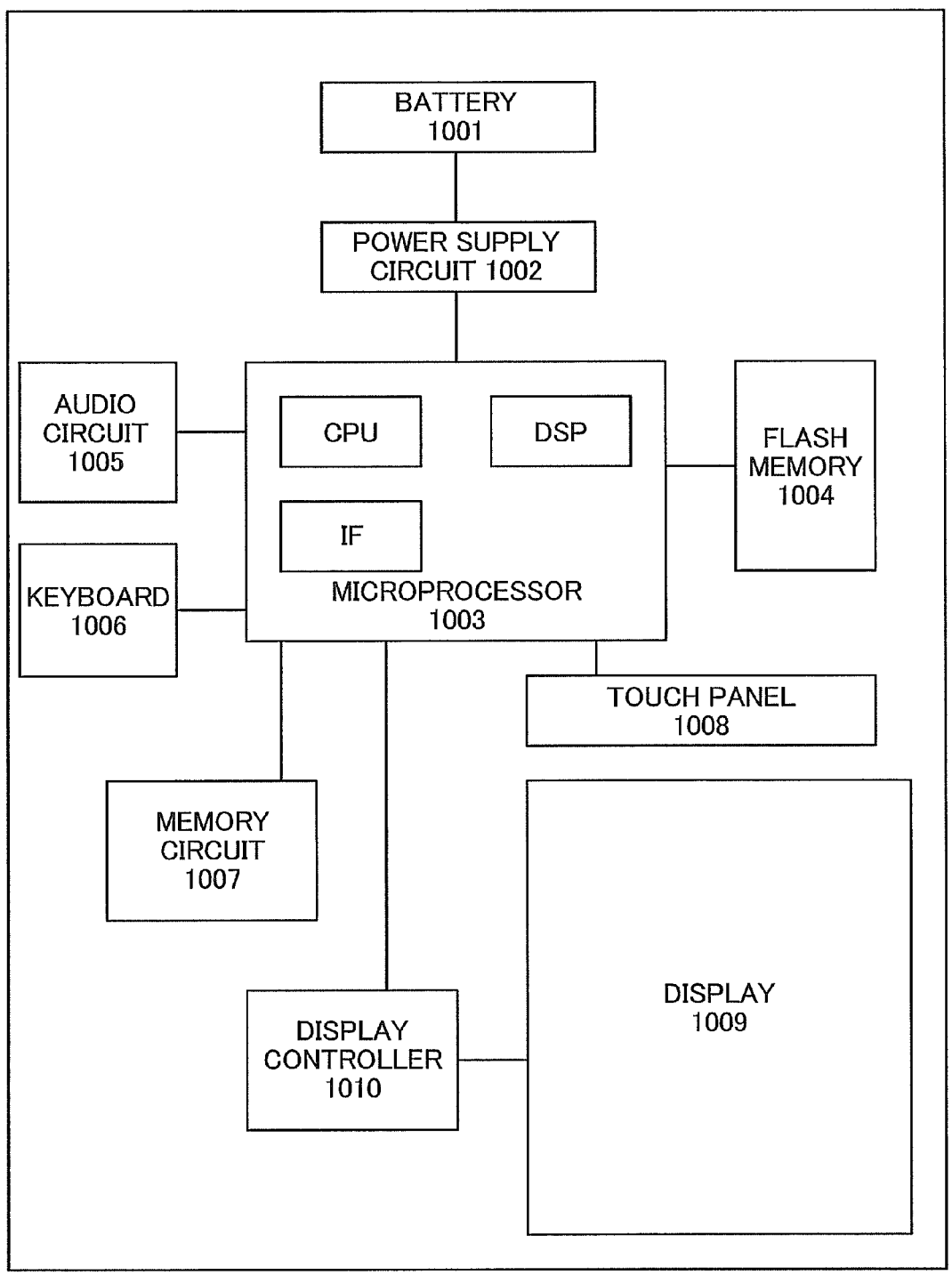
FIG. 11 is a block diagram illustrating an example of a semiconductor device of one embodiment of the present invention.

FIG. 11 is a block diagram of an electronic book. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function to temporarily hold the contents of a book. For example, when a user uses a highlight function, the memory circuit 1007 stores and holds data of a portion specified by the user. Note that the highlight function is used to make a difference between a specific portion and the other portions while reading an electronic book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor device described in any of the above embodiments, data can be written and read at high speed and held for a long time, and power consumption can be sufficiently reduced.

As described above, the portable devices described in this embodiment each incorporate the semiconductor device according to any of the above embodiments. Therefore, it is possible to obtain a portable device with low power consumption which is capable of reading data at high speed, holding data for a long time. In addition, by employing the trench structure for a transistor of one embodiment of the present invention, the planar area of the semiconductor device can be reduced, so that higher integration can be achieved. Further, in the transistor of one embodiment of the present invention, since an oxide semiconductor film is formed along the trench, a channel length can be secured even when the transistor is a highly integrated transistor; thus, a short channel effect is suppressed. Further, side portions of the trench have side surfaces substantially perpendicular to the top surface of the oxide insulating layer, and since the width between the upper ends of the trench is greater than or equal to 1 time and less than or equal to 1.5 times the width between the side surfaces of the trench, a miniaturized transistor in which the width between the side surfaces of the trench is made small can be manufactured; thus, the semiconductor device can be further highly integrated.

The configurations, methods, and the like described in this embodiment can be combined as appropriate with any of the configurations, methods, and the like described in the other embodiments.

EXAMPLE 1

In this example, as a sample, an oxide insulating layer having a trench which can be used for a transistor of one embodiment of the present invention was formed, and is referred to as an example sample 1. Further, as a comparative example, an oxide insulating layer having a trench was formed through forming steps which were different from those of the example sample 1. Forming steps of the comparative sample and the example sample 1 are described.

First, in each of the example sample 1 and a comparative sample, a silicon oxide film having a thickness of 400 nm was formed as the oxide insulating layer over a silicon substrate by a sputtering method.

The silicon oxide film was formed using a silicon oxide ($SiO_2$) target as a target under the conditions where the distance between the silicon substrate and the target was 60 mm, the pressure was 0.4 Pa, the power of the power source was 2 kW, the atmosphere was an argon and oxygen atmosphere (the argon flow rate was 25 sccm, and the oxygen flow rate was 25 sccm), and the substrate temperature was 100° C.

In the example sample 1, a resist mask was formed over the silicon oxide film through a photolithography process, and the trench was formed by etching the silicon oxide film using the resist mask. The etching step (first plasma etching) was performed by an inductively coupled plasma (ICP) etching method under the conditions where the etching gas was trifluoromethane ($CHF_3$), helium (He), and methane ($CH_4$) ($CHF_3$:He:$CH_4$=22.5 sccm:127.5 sccm:5 sccm), the power of the power source was 475 W, the bias power was 300 W, the pressure was 3.5 Pa, the substrate temperature was 70° C., and the treatment time was 60 seconds.

After that, etching which had different conditions (second plasma etching treatment) was performed. The second plasma etching treatment was performed by an inductively coupled plasma (ICP) etching method under the conditions where the etching gas was sulfur hexafluoride ($SF_6$:$SF_6$=100 sccm), the power of the power source was 3000 W, the bias power was 0 W, the pressure was 0.67 Pa, the substrate temperature was 40° C., and the treatment time was 80 seconds.

On the other hand, for the comparative sample, a resist mask was formed over the silicon oxide film through a photolithography process, and the trench was formed by etching the silicon oxide film using the resist mask. As the etching step, similar conditions to the first plasma etching of the example sample 1 were used.

In both of the example sample 1 and the comparative sample, the etching step was followed by ashing with oxygen (with a power of the power source of 200 W under a pressure of 66.5 Pa (0.5 Torr) for 120 seconds). Further, in a cross section of the trench, a depth (indicated by d in FIG. 1B) was approximately 250 nm and a width (indicated by L1 in FIG. 1B) between the side surfaces was approximately 300 nm.

Then, the resist mask was removed from the silicon oxide film with the use of a stripper, and after that, planarization treatment was performed in an argon atmosphere. The planarization treatment was performed by an inductively coupled plasma (ICP) etching method under the conditions where the etching gas was argon (Ar:Ar=100 sccm), the power of the power source was 500 W, the bias power was 100 W, the pressure was 1.35 Pa, and the treatment time was 180 seconds.

Figure 12:
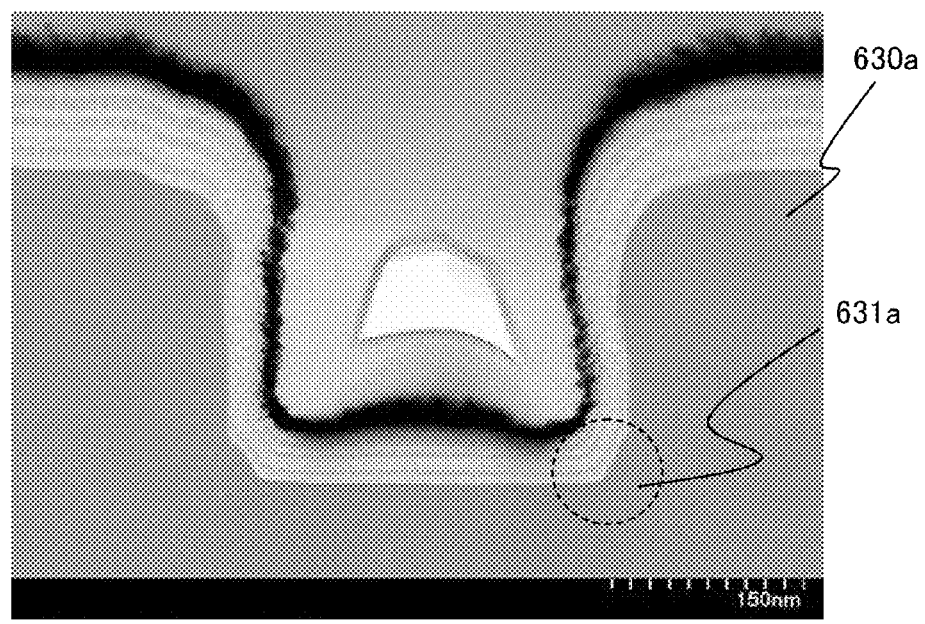
FIG. 12 is a cross-sectional TEM image illustrating a comparative sample described in Example 1.
Figure 13:
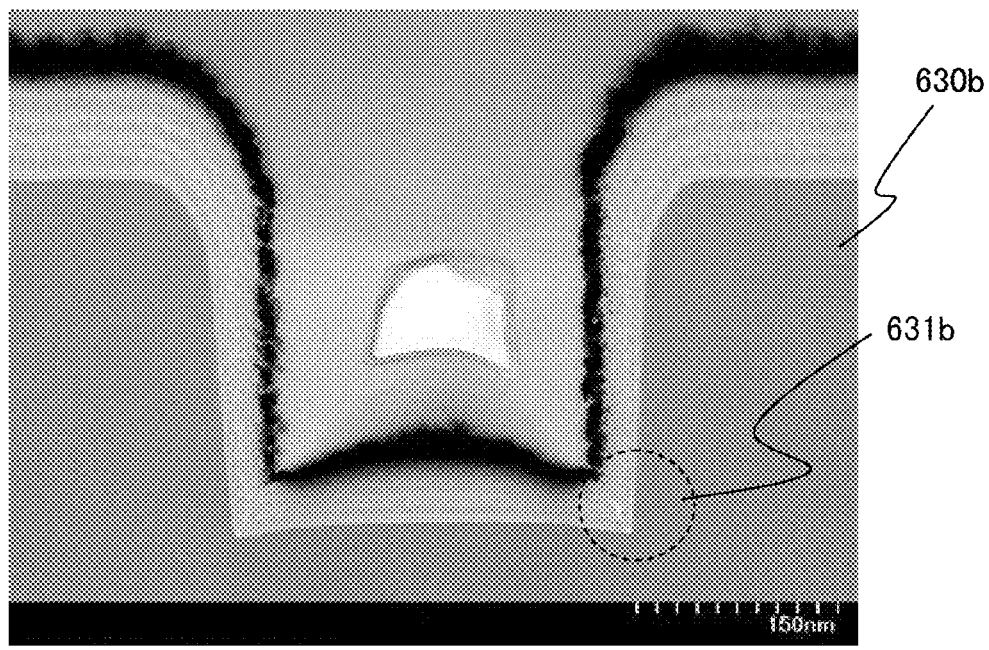
FIG. 13 is a cross-sectional TEM image illustrating an example sample described in Example 1.

FIG. 12 is a cross-sectional transmission electron microscopy (TEM) image of the example sample 1 obtained through the above steps. FIG. 13 is a cross-sectional TEM image of the comparative sample.

As illustrated in FIG. 12, an oxide insulating layer 630a of the example sample 1 has a trench structure. A lower corner portion 631a of the trench is curved. The curvature radius of the curved surface of the lower corner portion 631a is 25 nm to 65 nm, inclusive. In the example sample 1, lower corner portions curved with a curvature radius of 20 nm to 70 nm, inclusive, was formed. On the other hand, in the comparative sample illustrated in FIG. 13, a trench was formed in the oxide insulating layer 630b, and a lower corner portion 631b of the trench is angled.

Further, the side portions in the example sample 1 have side surfaces substantially perpendicular to the top surface of the oxide insulating layer, and the width between the upper ends of the trench is not increased as compared to the width between the side surfaces of the trench.

This result shows that the example sample 1 manufactured in this example has the curved lower corner portions and the side portions including the side surfaces substantially perpendicular to the top surface of the oxide insulating layer, and the width between the upper ends of the trench is greater than or equal to 1 time and less than or equal to 1.5 times the width between the side surfaces of the trench.

A transistor is formed in the trench in the oxide insulating layer, which is described in this example, so that a transistor with stable electronic characteristics and in which a short-channel effect is suppressed can be provided. Further, when the trench formed in the oxide insulating layer, which is described in this example, is used, a miniaturized transistor can be manufactured.

EXAMPLE 2

In this example, an oxide insulating layer having a trench was formed and an oxide semiconductor film was formed over the trench, and the coverage with the oxide semiconductor film was observed.

A manufacturing method of a sample used in this example is described below. Note that the sample manufactured in this example is referred to as an example sample 2.

First, a silicon oxide film having a thickness of 400 nm was formed as the oxide insulating layer over a silicon substrate by a sputtering method.

The silicon oxide film was formed using a silicon oxide ($SiO_2$) target as a target under the conditions where the distance between the silicon substrate and the target was 60 mm, the pressure was 0.4 Pa, the power of the power source was 2 kW, the atmosphere was an argon and oxygen atmosphere (the argon flow rate was 25 sccm, and the oxygen flow rate was 25 sccm), and the substrate temperature was 100° C.

Next, a resist mask was formed over the silicon oxide film by a photolithography process, and the silicon oxide film was etched using the resist mask to form a trench. As the etching step, first plasma etching treatment and second plasma etching treatment were performed. The first plasma etching treatment was performed by an inductively coupled plasma (ICP) etching method under the conditions where the etching gas was trifluoromethane ($CHF_3$), helium (He), and methane ($CH_4$) ($CHF_3$:He:$CH_4$=22.5 sccm:127.5 sccm:5 sccm), the power of the power source was 475 W, the bias power was 300 W, the pressure was 3.5 Pa, the substrate temperature was 70° C., and the treatment time was 60 seconds. The second plasma etching treatment was performed by an inductively coupled plasma (ICP) etching method under the conditions where the etching gas was trifluoromethane ($CHF_3$), helium (He), and methane ($CH_4$) ($CHF_3$:He:$CH_4$=22.5 sccm:127.5 sccm:5 sccm), the power of the power source was 3000 W, the bias power was 0 W, the pressure was 3.5 Pa, the substrate temperature was 70° C., and the treatment time was 60 seconds.

Note that the etching step was followed by ashing with oxygen (with a power of the power source of 200 W under a pressure of 66.5 Pa (0.5 Torr) for 120 seconds). In a cross section of the trench, the length of the side surface (the depth d of the trench in FIG. 1B) was approximately 250 nm, and the width of the side surface (the length L1 in FIG. 1B) were about 300 nm.

The resist mask formed over the silicon oxide film was removed using a stripping solution, and an In—Ga—Zn—O film was formed by a sputtering method as the oxide semiconductor film which is in contact with the side portions and the bottom surface of the trench and the top surface of the insulating layer.

In the example, the oxide semiconductor film was formed while the substrate was heated to 400° C. Note that the In—Ga—Zn—O film was formed using an oxide target having a composition ratio of In:Ga:Zn=1:1:1 [atomic ratio] under the conditions where the distance between the silicon substrate and the target was 60 mm, the pressure was 0.4 Pa, the direct-current (DC) power was 0.5 kW, and the atmosphere was an argon and oxygen atmosphere (the argon flow rate was 30 sccm, and the oxygen flow rate was 15 sccm). The intended thickness of the oxide semiconductor film was 20 nm.

Figure 14A:
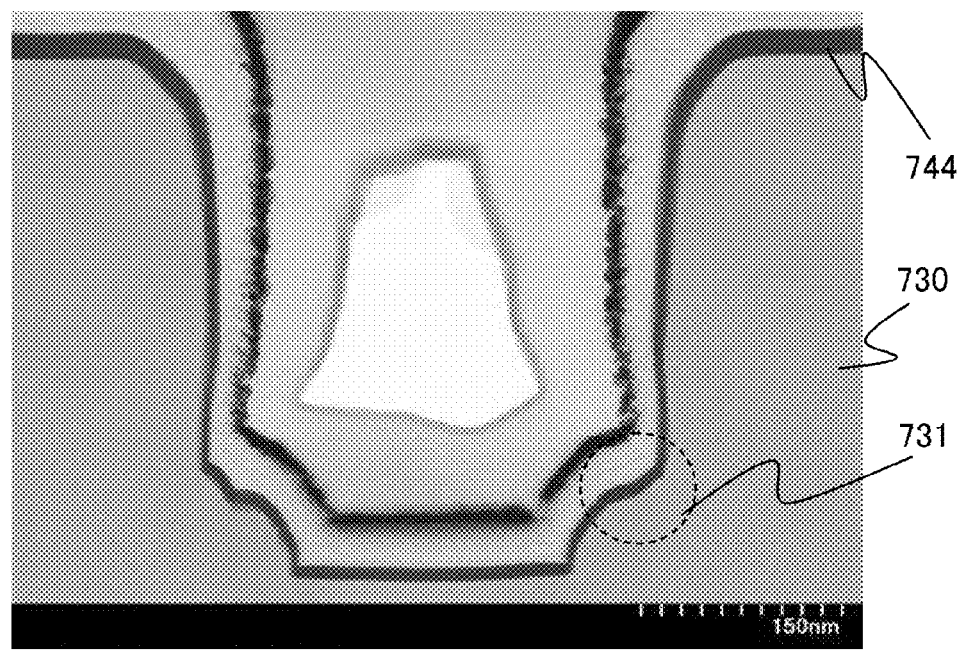
FIGS. 14A and 14B are cross-sectional TEM images illustrating an example sample described in Example 2.
Figure 14B:
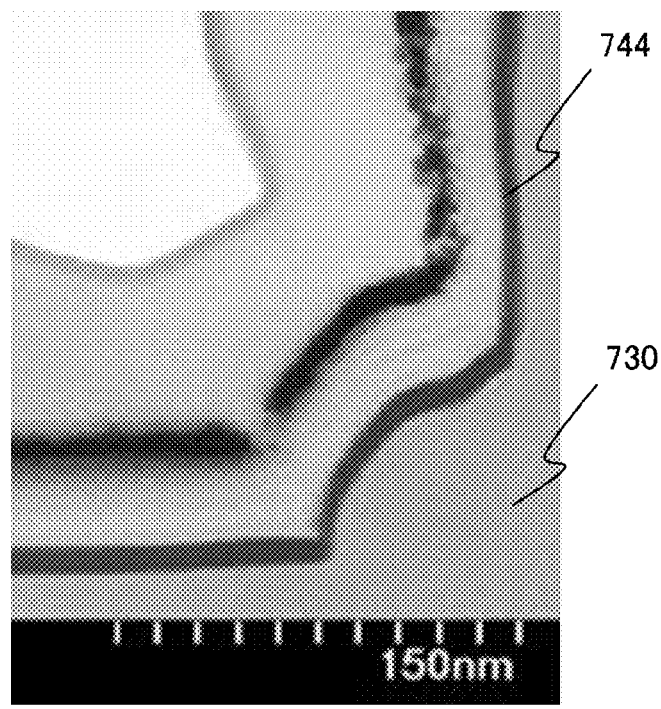

FIGS. 14A and 14B illustrate cross-sectional TEM images illustrating the example sample 2 formed by the above steps. Note that FIG. 14B is an enlarged view of the cross-sectional TEM image illustrated in FIG. 14A.

The example sample 2 illustrated in FIG. 14A includes an oxide insulating layer 730 in which a trench was provided and an oxide semiconductor film 744 which was formed along the trench. Lower corner portions 731 of the trench are curved. As illustrated in FIG. 14B, the thickness of the oxide semiconductor film 744 formed along the trench is not small even at the corner portion of the trench. Thus, the oxide semiconductor film 744 adequately covers the oxide insulating layer.

This result shows that the oxide semiconductor film which is formed along the trench whose lower corner portions are curved and adequately covers the oxide insulating layer can be formed. Accordingly, the transistor including a trench formed by the manufacturing method described in this example has stable electric characteristics.

This application is based on Japanese Patent Application serial no. 2011-160097 filed with Japan Patent Office on Jul. 21, 2011, the entire contents of which are hereby incorporated by reference.

What is claimed is:

1. A manufacturing method of a semiconductor device comprising:
   forming an oxide insulating layer;
   forming a depressed portion including side surfaces substantially perpendicular to a top surface of the oxide insulating layer in the oxide insulating layer by performing first plasma etching treatment;
   forming a trench including curved lower corner portions by performing second plasma etching treatment on the depressed portion;
   forming an oxide semiconductor film in contact with a bottom portion, the curved lower corner portions, and side portions of the trench in the oxide insulating layer;
   forming a source electrode and a drain electrode electrically connected to the oxide semiconductor film;
   forming a gate insulating layer over the oxide semiconductor film; and
   forming a gate electrode over the gate insulating layer,
   wherein the first plasma etching treatment is performed with application of a first bias power and a first power,
   wherein the second plasma etching treatment is performed with application of a second bias power and a second power, and
   wherein the second bias power is lower than the first bias power.

2. The manufacturing method of a semiconductor device according to claim 1, wherein a curvature radius of the curved lower corner portions is 20 nm to 70 nm, inclusive.

3. The manufacturing method of a semiconductor device according to claim 1, wherein a width between the side surfaces of the trench is 0.2 μm to 0.3 μm, inclusive.

4. The manufacturing method of a semiconductor device according to claim 1, wherein a width between upper ends of the trench is greater than or equal to 1 time and less than or equal to 1.5 times a width between the side surfaces of the trench.

5. The manufacturing method of a semiconductor device according to claim 1, wherein power density of the second bias power used in the second plasma etching treatment is 0 W/cm$^2$ to 0.03 W/cm$^2$, inclusive.

6. A manufacturing method of a semiconductor device comprising:
   forming an oxide insulating layer;
   forming a depressed portion including side surfaces substantially perpendicular to a top surface of the oxide insulating layer in the oxide insulating layer by performing first plasma etching treatment;
   forming a trench including curved lower corner portions and curved upper corner portions by performing second plasma etching treatment and third plasma etching treatment on the depressed portion;
   forming an oxide semiconductor film in contact with a bottom portion, the curved lower corner portions, and side portions of the trench in the oxide insulating layer;
   forming a source electrode and a drain electrode electrically connected to the oxide semiconductor film;
   forming a gate insulating layer over the oxide semiconductor film; and
   forming a gate electrode over the gate insulating layer,
   wherein the first plasma etching treatment is performed with application of a first bias power and a first power,
   wherein the second plasma etching treatment is performed with application of a second bias power and a second power,
   wherein the third plasma etching treatment is performed in a rare gas atmosphere, and
   wherein the second bias power is lower than the first bias power.

7. The manufacturing method of a semiconductor device according to claim 6, wherein a curvature radius of the curved lower corner portions is 20 nm to 70 nm, inclusive.

8. The manufacturing method of a semiconductor device according to claim 6, wherein a width between the side surfaces of the trench is 0.2 μm to 0.3 μm, inclusive.

9. The manufacturing method of a semiconductor device according to claim 6, wherein a width between upper ends of the trench is greater than or equal to 1 time and less than or equal to 1.5 times a width between the side surfaces of the trench.

10. The manufacturing method of a semiconductor device according to claim 6, wherein power density of the second bias power used in the second plasma etching treatment is 0 W/cm$^2$ to 0.03 W/cm$^2$, inclusive.

* * * * *